US005554872A

United States Patent [19]
Baba et al.

[11] Patent Number: 5,554,872
[45] Date of Patent: Sep. 10, 1996

[54] SEMICONDUCTOR DEVICE AND METHOD OF INCREASING DEVICE BREAKDOWN VOLTAGE OF SEMICONDUCTOR DEVICE

[75] Inventors: Yoshiro Baba, Yokohama; Shunichi Hiraki, Nagareyama; Akihiko Osawa, Machida, all of Japan

[73] Assignee: Kabushiki Kaisha Toshiba, Kawasaki, Japan

[21] Appl. No.: 412,215

[22] Filed: Mar. 27, 1995

Related U.S. Application Data

[63] Continuation of Ser. No. 881,853, May 12, 1992, abandoned.

[30] Foreign Application Priority Data

May 13, 1991 [JP] Japan .................................. 3-137285

[51] Int. Cl.⁶ .................................................. H01L 29/76
[52] U.S. Cl. .......................... 257/342; 257/343; 257/347; 257/492; 257/901
[58] Field of Search ..................... 257/492, 493, 257/524, 525, 526, 901, 342, 343, 347, 487

[56] References Cited

U.S. PATENT DOCUMENTS

| | | | |
|---|---|---|---|
| 4,232,328 | 11/1980 | Hartman et al. | 257/525 |
| 4,242,697 | 12/1980 | Berthold et al. | 257/524 |
| 4,587,656 | 5/1986 | Hartman et al. | 257/524 |
| 4,593,458 | 6/1986 | Adler | 257/492 |
| 4,626,879 | 12/1986 | Colak | 257/901 |
| 4,639,761 | 1/1987 | Singer et al. | 257/901 |
| 4,884,116 | 11/1989 | Shirai . | |
| 5,113,236 | 5/1992 | Arnold et al. | 257/492 |
| 5,241,210 | 8/1993 | Nakagawa et al. | 257/520 |
| 5,327,006 | 7/1994 | Beasom | 257/524 |
| 5,362,979 | 11/1994 | Merchant | 257/347 |
| 5,448,100 | 9/1995 | Beasom | 257/492 |

FOREIGN PATENT DOCUMENTS

| | | |
|---|---|---|
| 0285593 | 5/1988 | European Pat. Off. . |
| 0307844 | 3/1989 | European Pat. Off. . |
| 0311419 | 4/1989 | European Pat. Off. . |

OTHER PUBLICATIONS

Chang et al., "500–V. n–Channel Insulated–Gate Bipolar Transistor with a Trench Gate Structure", IEEE Transactions On Electron Devices, vol. 36, No. 9, Sep., 1989, pp. 1824–1829.

*Primary Examiner*—Sara W. Crane
*Assistant Examiner*—Courtney A. Bowers
*Attorney, Agent, or Firm*—Finnegan, Henderson, Farabow, Garrett & Dunner, L.L.P.

[57] ABSTRACT

In a semiconductor device including a composite substrate formed by bonding first and second semiconductor substrates to each other through an oxide film and an insulator isolation trench formed from a major surface of the first semiconductor substrate to reach the oxide film and to surround an element forming region, when the potential of the second substrate is set at a potential higher than the minimum potential in the element forming region of the first substrate, an breakdown voltage can be increased. In a semiconductor integrated circuit having an element isolation region, a semiconductor device of a perfect dielectric isolation structure having an element forming region having a thickness smaller than that of the element forming region of a P-N junction isolation structure is used to reduce, e.g., a base curvature influence, thereby obtaining a further high breakdown voltage.

19 Claims, 16 Drawing Sheets

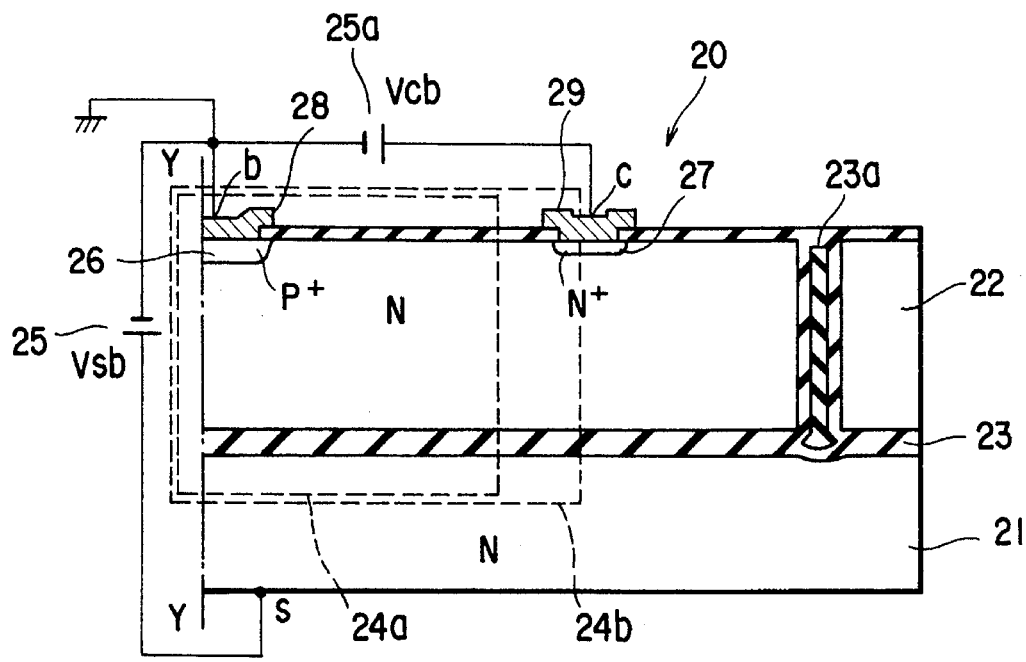
F I G. 5
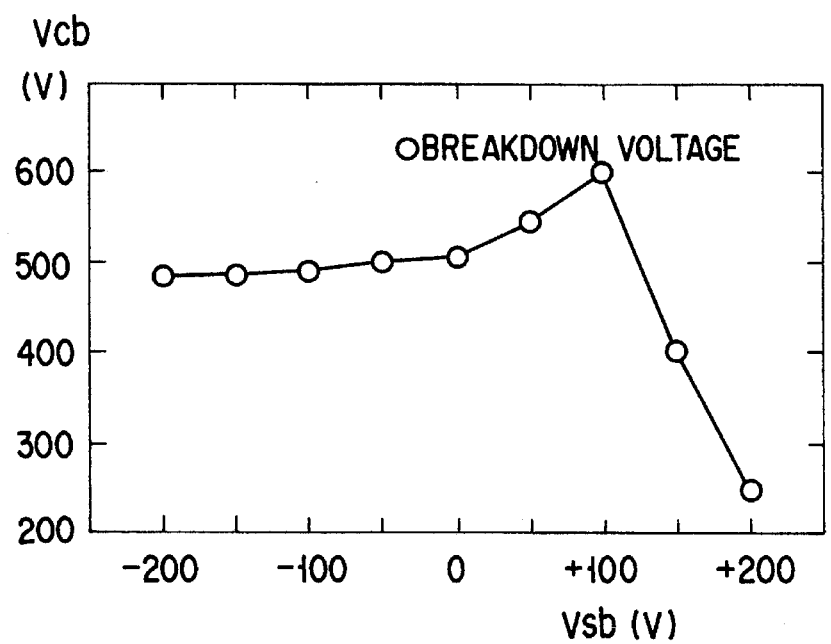
F I G. 6

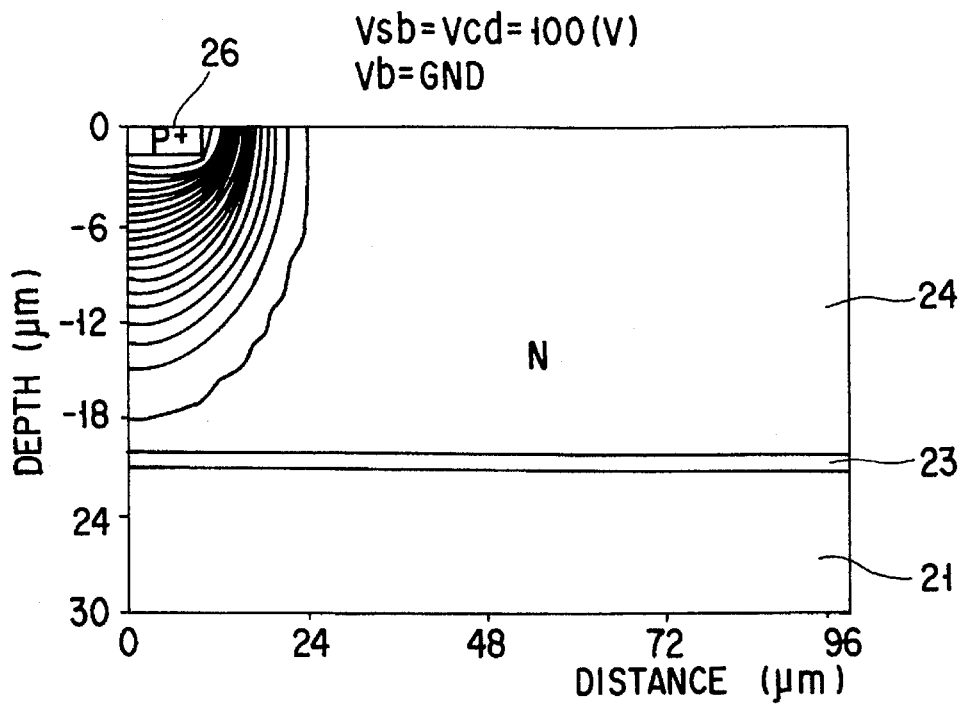
F I G. 7A
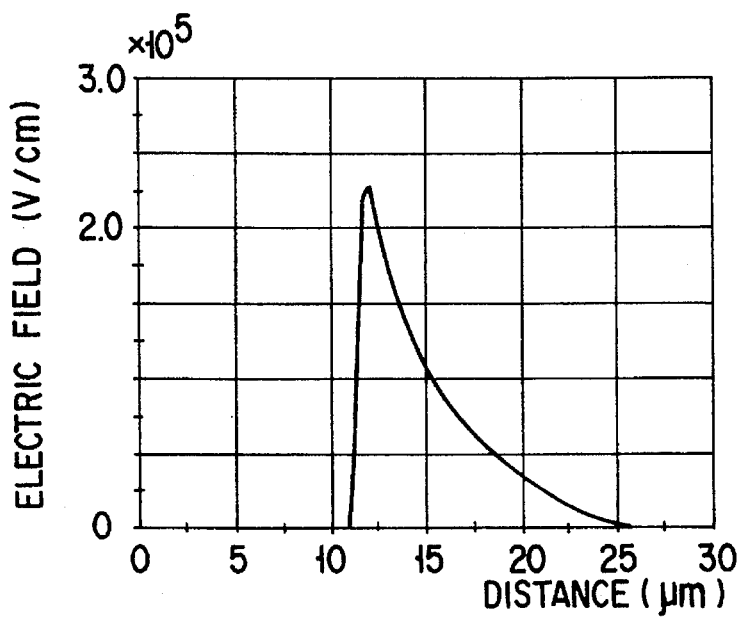
F I G. 7B

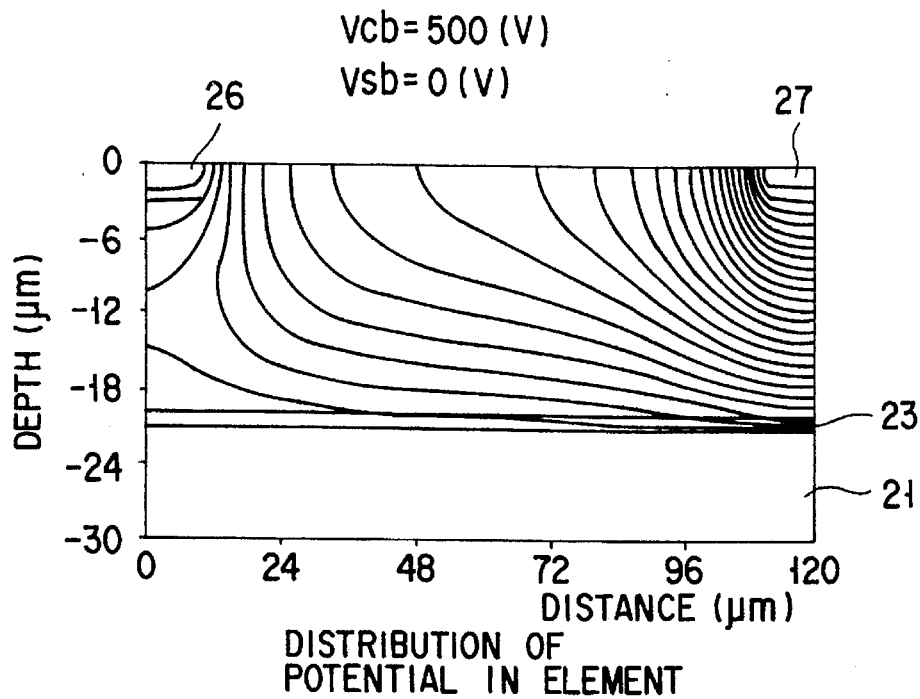
DISTRIBUTION OF
POTENTIAL IN ELEMENT
F I G. 9A
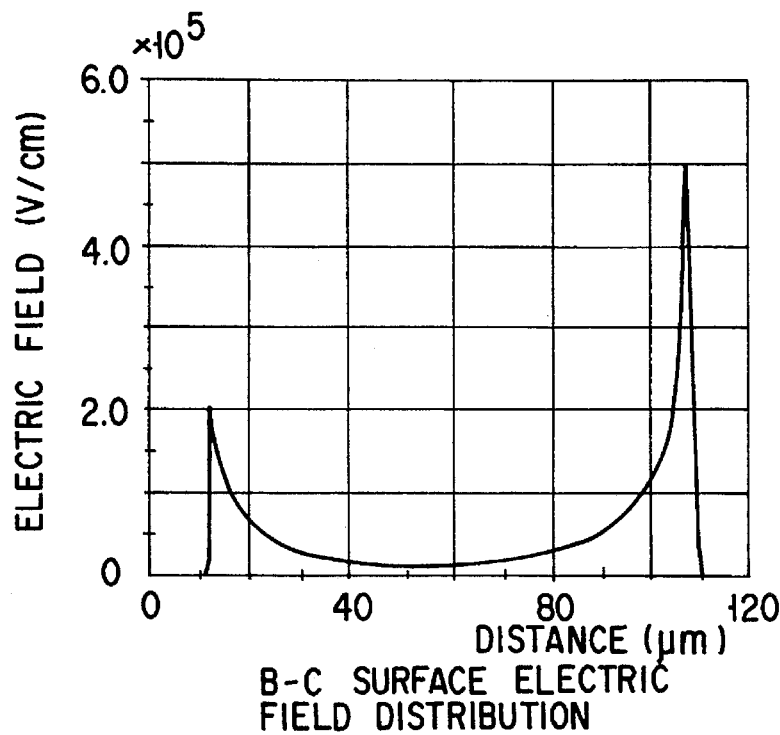
B-C SURFACE ELECTRIC
FIELD DISTRIBUTION
F I G. 9B

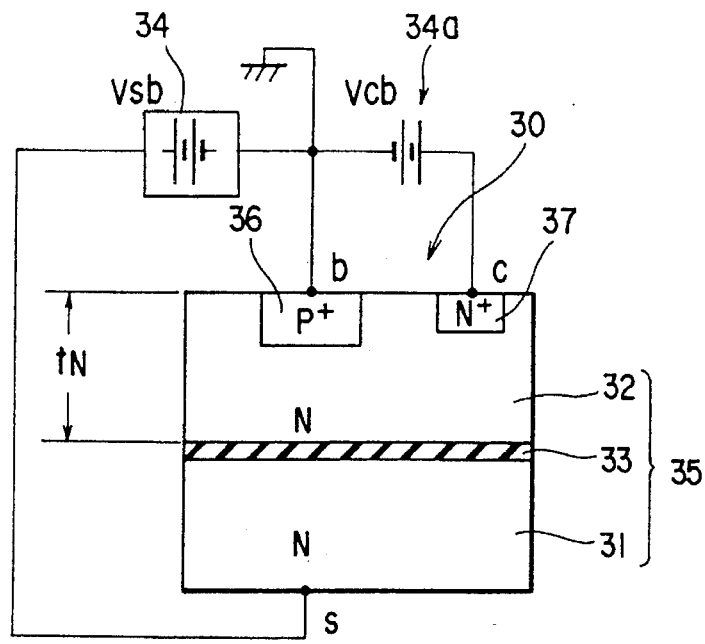
F I G. 12
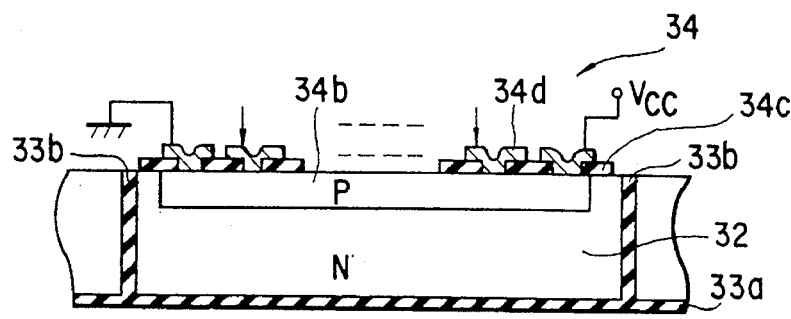
F I G. 13A
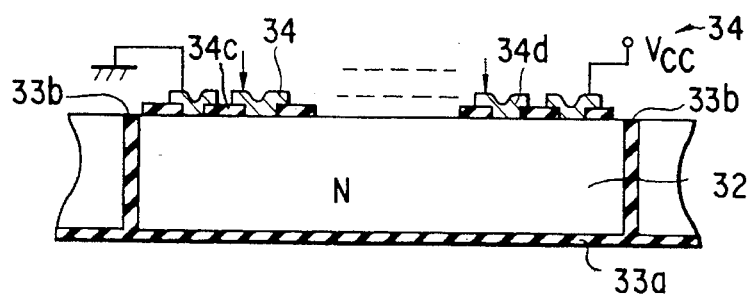
F I G. 13B
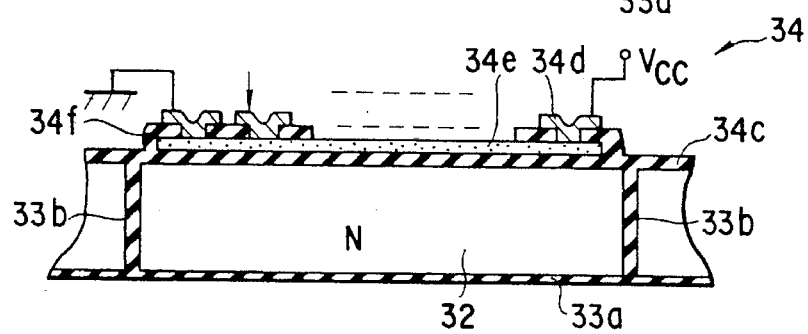
F I G. 13C

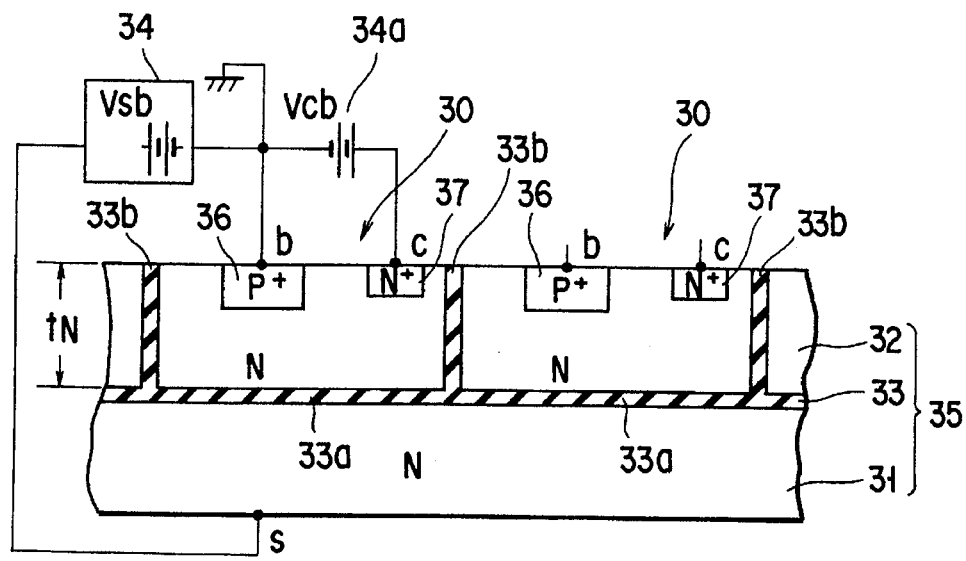
F I G. 14
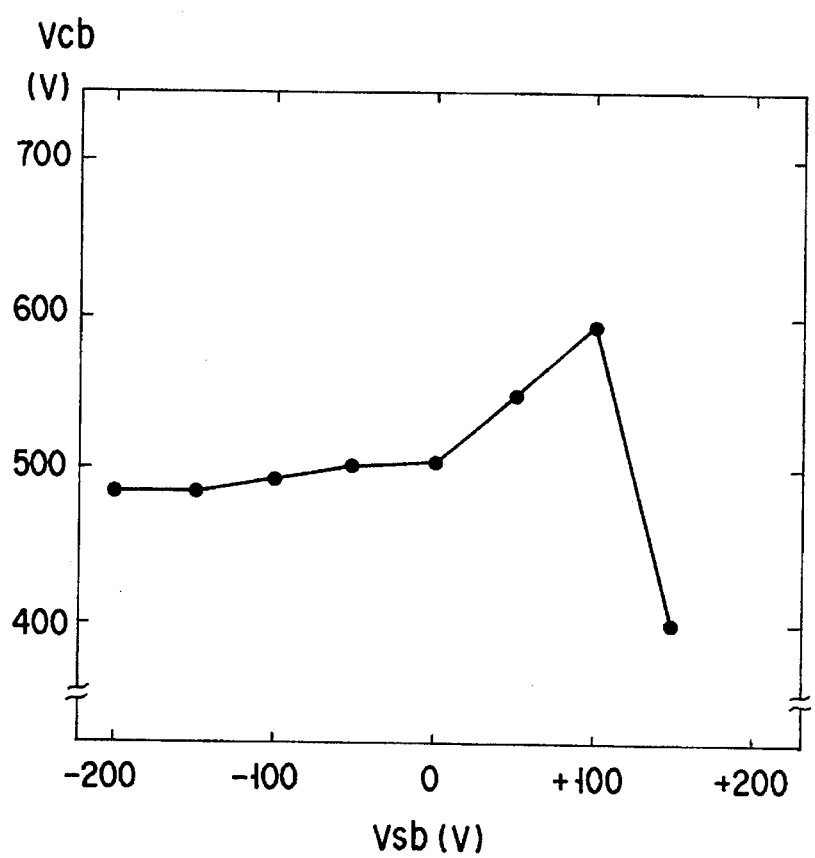
F I G. 15

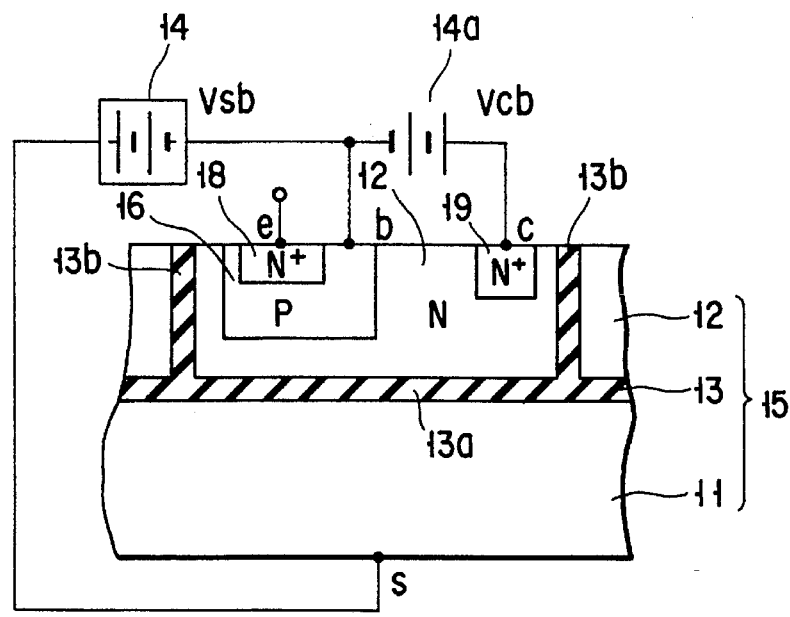
F I G. 16
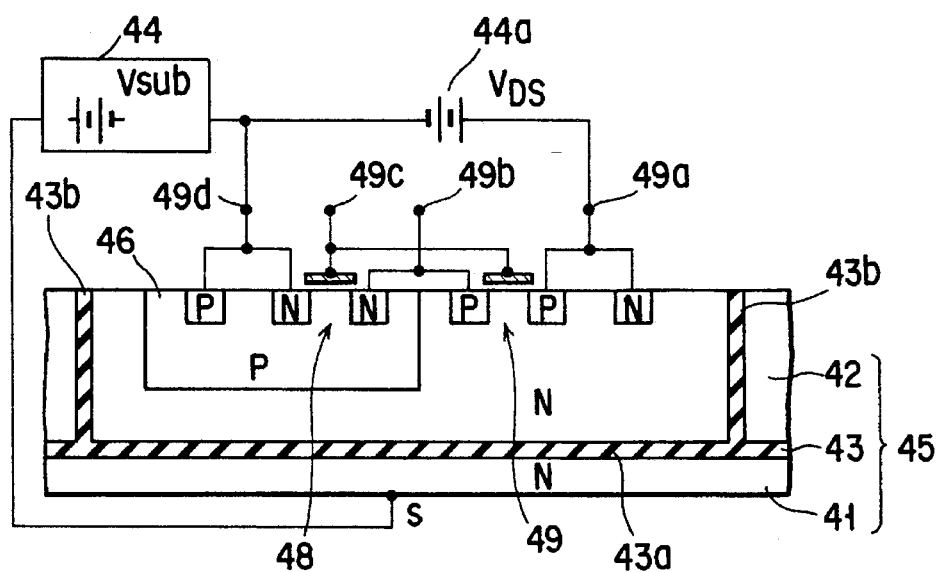
F I G. 17

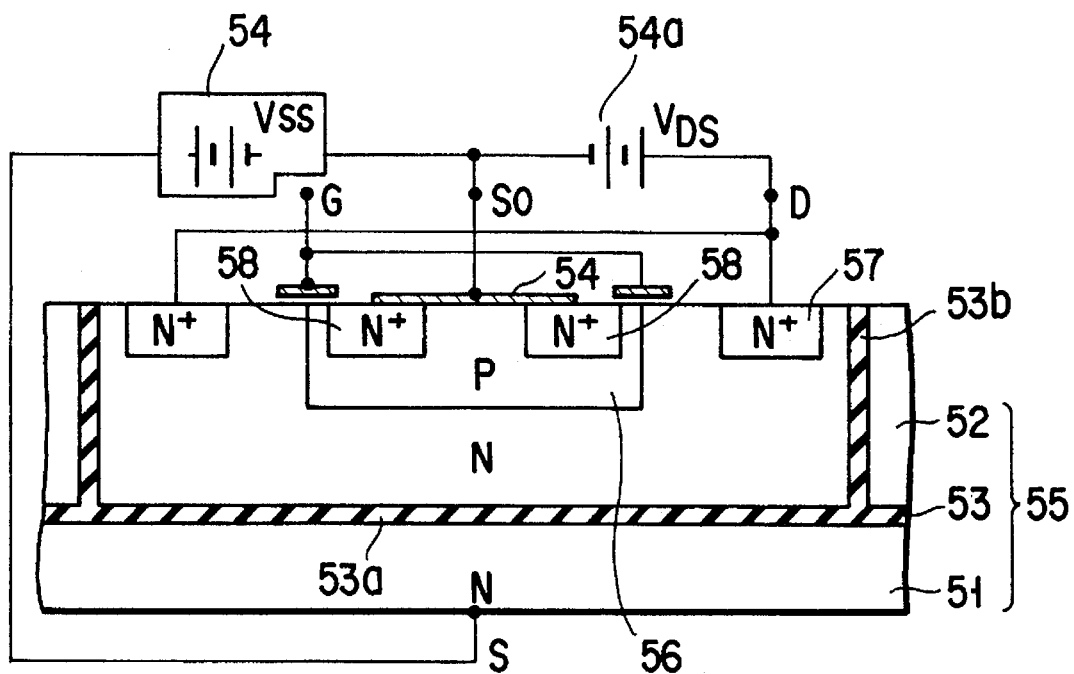
F I G. 18

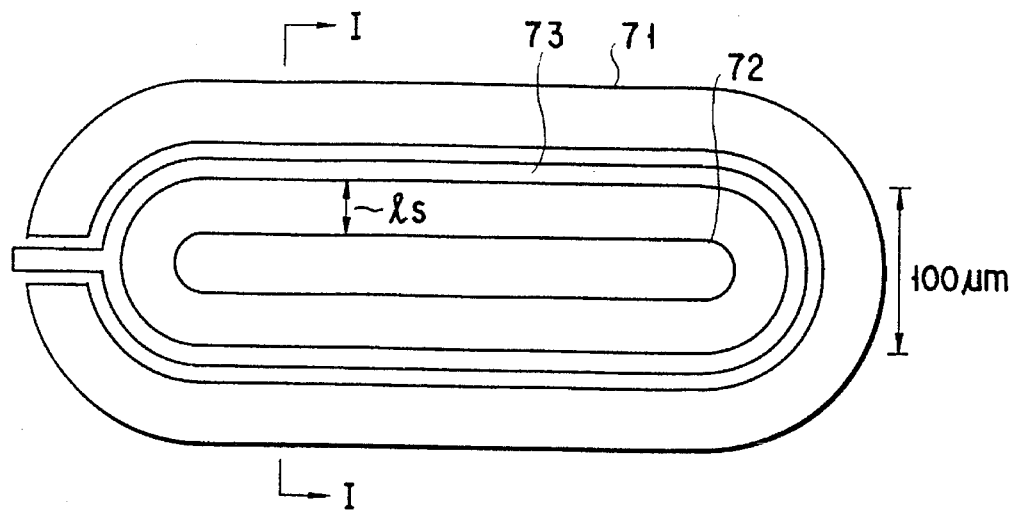
F I G. 19
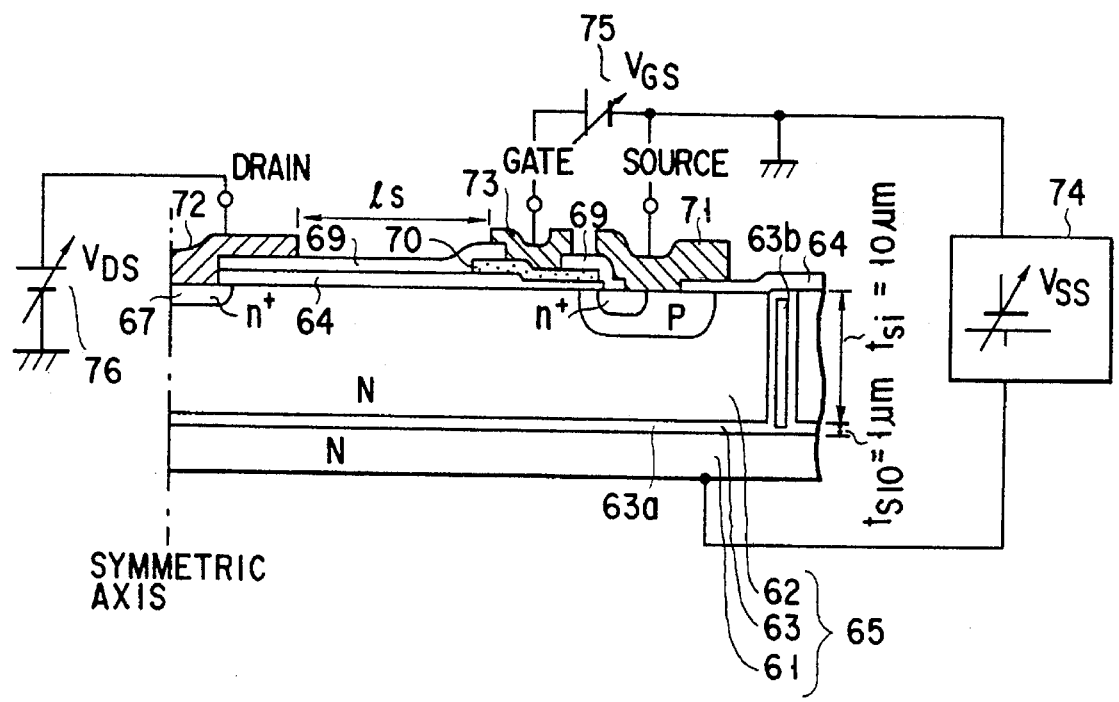
F I G. 20

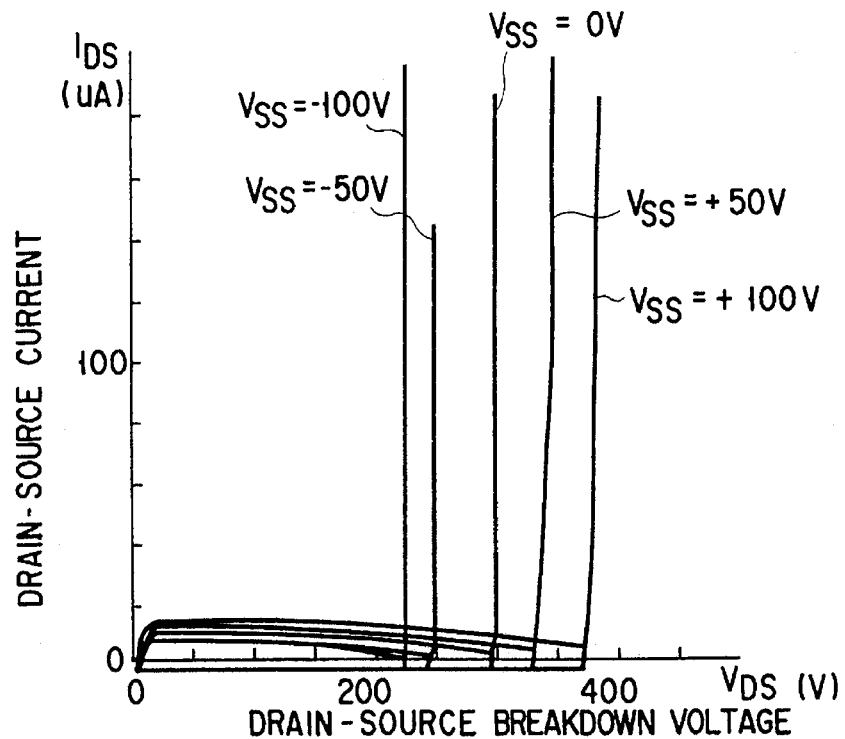
F I G. 21
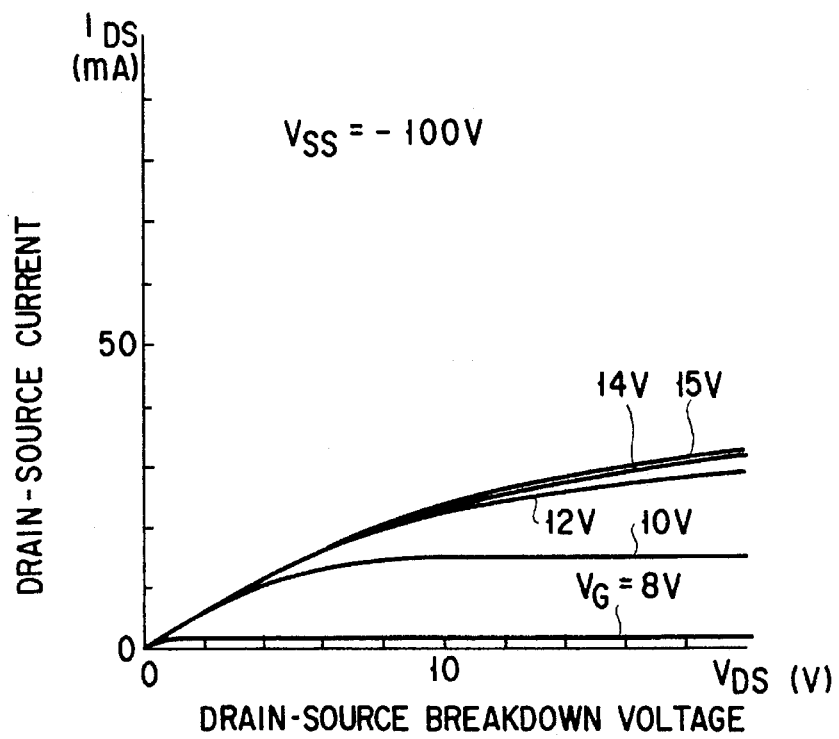
F I G. 22A 5,554,872

SEMICONDUCTOR DEVICE AND METHOD OF INCREASING DEVICE BREAKDOWN VOLTAGE OF SEMICONDUCTOR DEVICE

This application is a continuation of application Ser. No. 07/881,853, filed May 12, 1992, now abandoned.

BACKGROUND OF THE INVENTION

1. Field of the Invention

The present invention relates to a semiconductor device and a method of increasing a breakdown voltage of the semiconductor device and, more particularly, to a high-breakdown voltage semiconductor device having a perfect dielectric isolation structure using an oxide-film-bonded substrate, and a method of increasing a device breakdown voltage of the semiconductor device, and a method of decreasing an ON resistance of a lateral MOSFET.

2. Description of the Related Art

As the number of functions as well as the integration density of a semiconductor integrated circuit are increased, the application range of an element isolation technique has been extended.

FIG. 1 is a sectional view showing schematically an element isolation structure consisting of a P-N junction and a biasing method thereof. An N-type epitaxial layer is deposited on a P-type semiconductor substrate 1. A P$^+$-type isolation diffusion layer 3 is formed from the major surface of the N-type epitaxial layer to reach the P-type substrate 1 and to surround an element region 2 of the N-type epitaxial layer. In the element region 2, a P$^+$NN$^+$ diode is formed. An NPN transistor is formed in practice since, a breakdown voltage of only a collector junction may be often considered. For this reason, a P$^+$-type region 4, the N-type region 2, and an N$^+$-type region 5 of the diode are called a P$^+$-type base region 4, an N-type collector region 2, and an N$^+$-type collector region 5, respectively, for descriptive convenience. Reference symbols b and c also denote a base electrode terminal and a collector electrode terminal, respectively. The IC having a P-N junction isolation structure shown in FIG. 1 is generally used such that the minimum potential of the power supply voltage of the IC is applied to the P-type substrate 1. For example, when a power supply voltage is ±15 V, a voltage of −15 V is applied to the substrate 1. When only a power supply having a voltage +5 V is used, a bias voltage of 0 V (GND) is applied to the substrate 1. In FIG. 1, the negative terminal of a bias power supply $V_{cb}$ and a terminal S of the substrate 1 are grounded, and the potential of the P-type substrate 1 is fixed to be 0 V (GND). For this reason, the P-type substrate 1 and the N-type collector region 2 are normally set in a reverse bias state, thereby isolating the substrate 1 from the collector region 2 by a depletion layer. Note that this biasing method is a patent of Texas Instruments.

Drawbacks of the above conventional P-N junction isolation structure are roughly classified into a parasitic element effect and an increase in breakdown voltage of an element. First, in the parasitic element effect, although the potentials of the P-type substrate 1 and the P$^+$-type isolation diffusion layer 3 are fixed to be the minimum potential of the element region, a thyristor operation or a latch-up operation of a CMOS transistor is easily caused since a PNP parasitic transistor and the like are formed in the element formed in the element forming region 2. In order to avoid this drawback, a circuit design is inevitably restricted. In order to increase the breakdown voltage of the element, as shown in FIG. 2, the structure in which is an N$^+$-type buried layer 1a is formed in a P-type substrate 1 and an N-type epitaxial layer 2 is grown on the buried layer 1a is often used in the P-N junction isolation structure. In this case, a device breakdown voltage depends on the impurity concentration N and thickness $t_{VG}$ of an N-type epitaxial layer, i.e., an N-type collector region 2. The above breakdown voltage is represented by a bias voltage $V_{cb}$ obtained when a junction between a P$^+$-type base region 4 and the N-type collector region 2 is broken down.

FIG. 3 is a graph used for design of the breakdown voltage when the diode shown in FIG. 2 is formed in the stacked substrate consisting of the N-type epitaxial layer 2, the N$^+$-type buried layer 1a, and the P-type substrate 1. In this graph, the abscissa represents an impurity concentration $N_{sub}$ of the N-type epitaxial layer 2, the ordinate represents a breakdown voltage BV (V), and a parameter $t_{VG}$ (μm) is the thickness of the N-type epitaxial layer 2. Note that the breakdown voltage BV (V) is a voltage $V_{cb}$ obtained when a depletion layer 6 reaches the N$^+$-type buried layer 1a. This is called a reach through. For example, in a device having a breakdown voltage of 500 V, assuming that, as shown in FIG. 3, the concentration $N_{sub}$=4×10$^{14}$ atoms/cm$^3$ (a resistivity $\rho_{sub}$ is almost 10 Ω.cm) is satisfied, the thickness $t_{VG}$ of 33 μm or less is required to prevent the depletion layer 6 from reaching through the n$^+$-type buried layer 1a when the reverse vias voltage $V_{cb}$ is applied.

In general, a high-breakdown-voltage IC must be designed so that the depletion layer 6 reaches through the n$^+$-type buried layer 1a when a bias voltage near the breakdown voltage is applied. For this restriction, when high-breakdown-voltage elements each having a breakdown voltage of 500 V or more are to be integrated into an IC, the thickness $t_{VG}$ of the N-type epitaxial layer 2 must be set to be 30 μm or more. In this case, an effective element area is disadvantageously decreased due to lateral diffusion when P$^+$-type diffusion is performed to a depth of 30 μm or more to form the P$^+$-type diffusion layer 3. Even when deep trench isolation free from lateral diffusion is performed, i.e., isolation is performed by a deep insulator buried layer, the depth of a trench must be set to be 30 μm or more. The present trench technique cannot form this deep trench. In an IC having a P-N junction isolation structure, the thickness of an N-type epitaxial layer must be increased to obtain a high breakdown voltage. As a result, the depth of a P$^+$-type isolation diffusion layer is increased. The lateral diffusion of the diffusion layer is thus increased, thereby decreasing the effective element area. Consequently, an element having a high breakdown voltage cannot be obtained in practice.

On the other hand, there is a strong market need for a technical means for decreasing an area required for element isolation to increase an effective element area and to obtain a high breakdown voltage. As an element isolation structure to cope with this need, there is proposed a perfect dielectric isolation structure obtained by combining a deep trench and a composite semiconductor substrate obtained such that an oxide film is sandwiched and bonded between semiconductor substrates.

FIG. 4 is a sectional view showing a structure of a conventional semiconductor element having a perfect dielectric isolation structure. An element forming region which in surrounded by an insulator isolation trench 15 and an oxide interlayer 13 is formed in a N-type semiconductor substrate 12. A composite semiconductor substrate consists of the N-type first semiconductor substrate 12, the oxide interlayer 13, and an N- or P-type second semiconductor substrate 11. When an NPN transistor is to be formed in the element forming region, a P-type base region 16 and an N⁺-type collector region 19 are formed in the first semiconductor substrate 12, and an N⁺-type emitter region 38 is formed in a P-type base region 36. An N⁺-type buried layer 14 and a deep N⁺-type layer 17 are formed inside the oxide film 13 to form a current path for preventing saturation of a voltage $V_{ce}$ in an ON state. The collector region 19 is formed in contact with the layer 17. In this conventional element, since a depletion layer is stopped at the N⁺-type buried layer 14, a full depletion does not occur. The breakdown voltage of the element is disadvantageously low. In order to increase the breakdown voltage, the thickness of the first semiconductor substrate 12 must be increased. This fails to increase an integration density.

SUMMARY OF THE INVENTION

It is an object of the present invention to provide a semiconductor device and a method of increasing a device breakdown voltage of the semiconductor device wherein a semiconductor device having a perfect dielectric isolation structure a thickness of which is smaller than a thickness of an element forming region formed in the PN junction isolation structure is used, e.g., to reduce an influence of a base curvature, thereby obtaining a high breakdown voltage.

It is another object of the present invention to provide a semiconductor device and a method of decreasing an ON resistance of a lateral MOSFET wherein a semiconductor device having a perfect dielectric isolation structure a thickness of which is smaller than a thickness of an element forming region is used to decrease an ON resistance of a lateral MOSFET.

According to an aspect of the present invention, there is provided in a semiconductor device comprising a composite semiconductor substrate formed by bonding a first semiconductor substrate and a second semiconductor substrate through an oxide interlayer, the first semiconductor substrate including an element forming region having a thickness and an impurity concentration such that full depletion occurs in a depletion layer; and potential setting means for setting a potential of the second semiconductor substrate at a potential higher than a minimum potential in the element forming region of the first semiconductor substrate.

According to another aspect of the present invention, there is provided a semiconductor integrated circuit device comprising a composite semiconductor substrate formed by bonding a first semiconductor substrate and a second semiconductor substrate through an oxide interlayer, the first semiconductor substrate including an element forming region having a thickness and an impurity concentration such that full depletion occurs in a depletion layer, an insulator a semiconductor integrated circuit device comprising a composite semiconductor substrate formed by bonding a first semiconductor substrate and a second semiconductor substrate through an oxide interlayer, said first semiconductor substrate including an element forming region having a thickness and an impurity concentration such that full depletion occurs in a depletion layer, an insulator isolation trench formed from a major surface of said first semiconductor substrate to reach said oxide interlayer and to surround said element forming region and buried with an insulator, and potential setting means for setting a potential of said second semiconductor substrate at a potential higher than a minimum potential in said element forming region of said first semiconductor substrate.

According to still another aspect of the present invention, there is provided a method of increasing a device breakdown voltage of a semiconductor device, comprising the steps of determining a semiconductor substrate having a perfect dielectric isolation structure consisting of a composite semiconductor substrate formed by bonding a first semiconductor substrate and a second semiconductor substrate to each other through an oxide interlayer and an insulator isolation trench formed from a major surface of the first semiconductor substrate to reach the oxide interlayer and to surround the element region and buried with an insulator, determining a type of a semiconductor element formed in the element region, specifying a minimum potential used in the semiconductor element according to the type of the semiconductor element, and biasing a potential of the second semiconductor substrate to a potential higher than the minimum potential of the semiconductor element.

According to still another aspect of the present invention, there is provided a method of decreasing an ON resistance of a lateral MOSFET, comprising the steps of determining a semiconductor substrate having a perfect dielectric isolation structure consisting of a composite semiconductor substrate formed by bonding a first semiconductor substrate and a second semiconductor substrate to each other through an oxide interlayer and an insulator isolation trench formed from a major surface of the first semiconductor substrate to reach the oxide interlayer and to surround the element forming region and buried with an insulation, identifying a polarity of carriers in the first semiconductor substrate, and applying a bias voltage V having a polarity apposite to the polarity of the carries in the first semiconductor substrate to the second semiconductor substrate through the oxide interlayer to thereby decrease an ON resistance of the first semiconductor substrate.

The present invention is completed in a trial process for improving the breakdown voltage of a semiconductor substrate having a perfect dielectric isolation structure. That is, the device breakdown voltage is changed depending on the potential of the second semiconductor process substrate. In the trial process, it was found that the potential of the second semiconductor substrate for maximizing the device breakdown voltage had an optimal value. The present invention has been made on the basis of this inventors' findings. In the semiconductor device according to the present invention, even when a depletion layer formed by a junction between, e.g., a P-type base region and an N-type collector region in an element forming region extends according to an increase in reverse bias voltage to reach an isolation layer, the depletion layer is not immediately broken down since the isolation layer consists of an insulator unlike a conventional P-N junction isolation structure. That is, since a part of the bias voltage is applied to the insulating layer of the isolation layer, the breakdown of the depletion layer can be prevented. For this reason, the thickness of the element forming region can be set to be much smaller than that of the element forming region of a conventional P-N junction isolation structure.

The function of the potential of the second semiconductor substrate for a device breakdown voltage will be described as follows. The potential of the second semiconductor substrate influences a depletion layer (space charge layer) of an element forming region through an oxide interlayer (dielectric layer) to change an electric field distribution in the depletion layer. For this reason, the potential of the second semiconductor substrate has an optimal value which can relax an electric field strength of the curved portion of a P-type base region. The optimal value is a specific potential higher than a minimum potential in the element region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a sectional view showing an arrangement of a semiconductor element used in potential distribution analysis in an element according to the present invention;

FIG. 6 is a graph showing a relationship between a potential and a breakdown voltage of a second semiconductor substrate of the semiconductor element shown in FIG. 5;

FIG. 7A is a view showing a distribution of potentials in an element when substrate and collector potentials of an FD device are set to be equal to each other;

FIG. 7B is a graph showing a surface electric field distribution near a base junction of the FD device of FIG. 7A;

FIG. 9A is a view showing a distribution of potentials in an element when an FD device is used under conditions $V_{bc}$=500 V and $V_{sb}$=0;

FIG. 9B is a graph showing a surface electric field distribution between the base and collector of the FD device in FIG. 9A;

FIG. 12 is a sectional view showing an arrangement of a semiconductor device according to the first embodiment of the present invention and a connection of a bias voltage and the like;

FIGS. 13A to 13C are sectional views each showing an example of the bias power supply 34 in FIG. 12;

FIG. 14 is a sectional view showing an arrangement of a semiconductor device according to the second embodiment of the present invention and a connection of a bias voltage and the like;

FIG. 15 is a graph showing a relationship between a potential and a breakdown voltage of a second semiconductor substrate of the semiconductor device shown in FIG. 14;

FIG. 16 is a sectional view showing an arrangement of a semiconductor device according to the third embodiment of the present invention and connection of a bias voltage and the like;

FIG. 17 is a sectional view showing an arrangement of a semiconductor device according to the fourth embodiment of the present invention and connection of a bias voltage and the like;

FIG. 18 is a sectional view showing an arrangement of a semiconductor device according to the fifth embodiment of the present invention to explain a connection of a bias voltage and the like;

FIG. 19 is a plan view showing schematically an arrangement of a semiconductor device according to the sixth embodiment of the present invention;

FIG. 20 is a sectional view showing an arrangement of the semiconductor device taken along a line I—I in FIG. 19 and a connection of a bias voltage and the like;

FIG. 21 is a view showing a drain-source breakdown voltage vs, substrate potential characteristic of the semiconductor device in FIG. 19;

FIGS. 22A to 22C are views each showing an FET operation characteristic of the semicondutor device in FIG. 19;

DETAILED DESCRIPTION OF THE PREFERRED EMBODIMENTS

Figure 1:
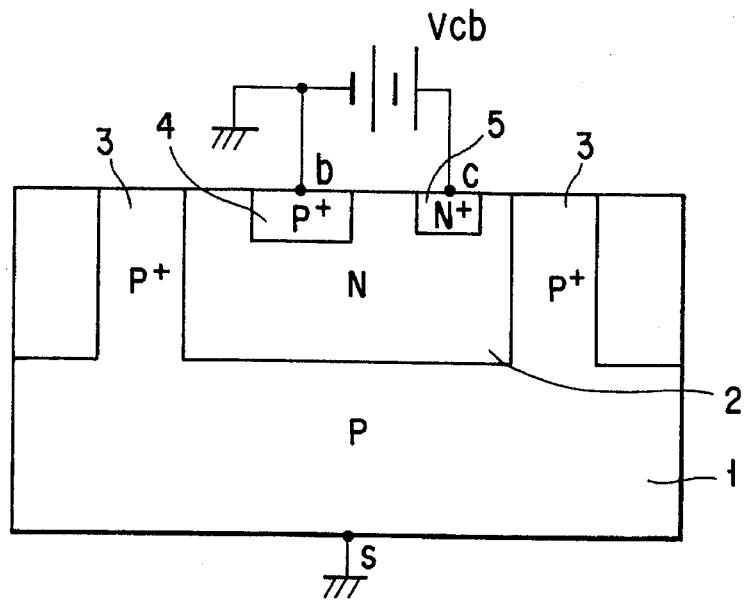
FIG. 1 is a sectional view showing a structure of a semiconductor element having a conventional P-N junction isolation structure to explain a bias connection.
Figure 2:
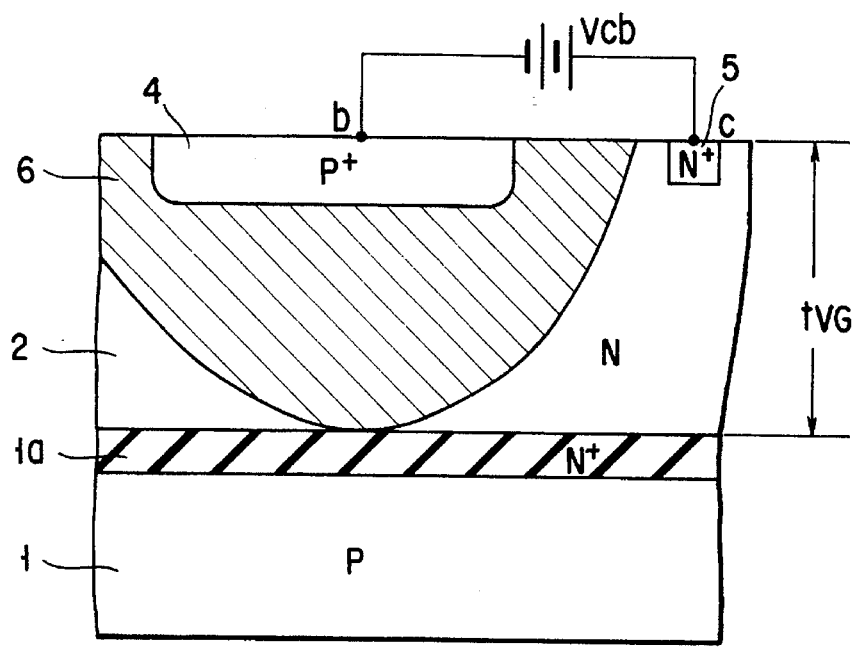
FIG. 2 is a sectional view for explaining a reach through state of a depletion layer of the element shown in FIG. 1.
Figure 3:
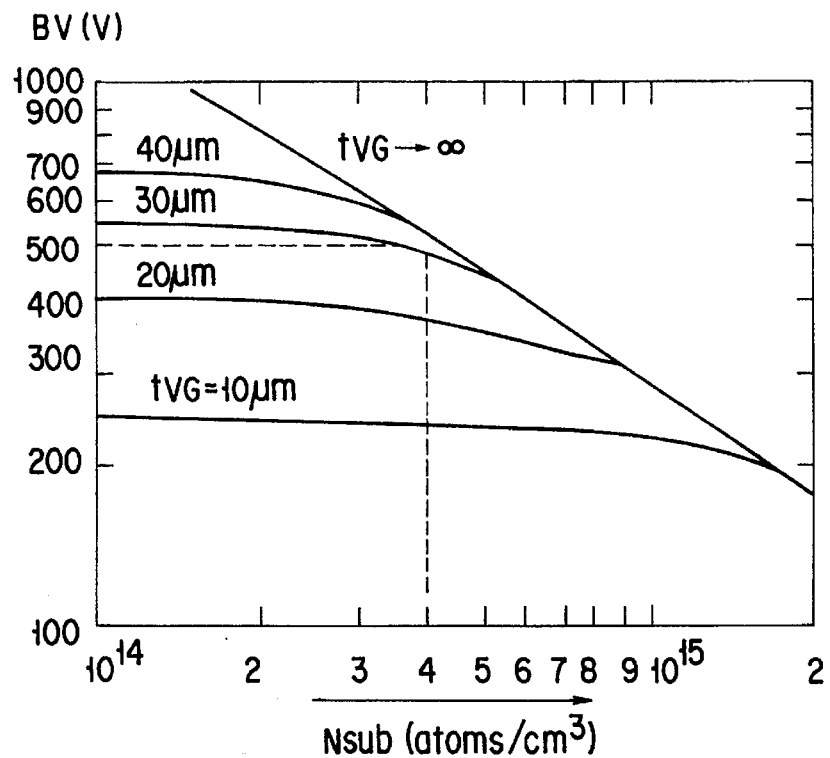
FIG. 3 is a graph showing a relationship between an impurity concentration and a breakdown voltage of an epitaxial layer used for conventional design of a breakdown voltage.
Figure 4:
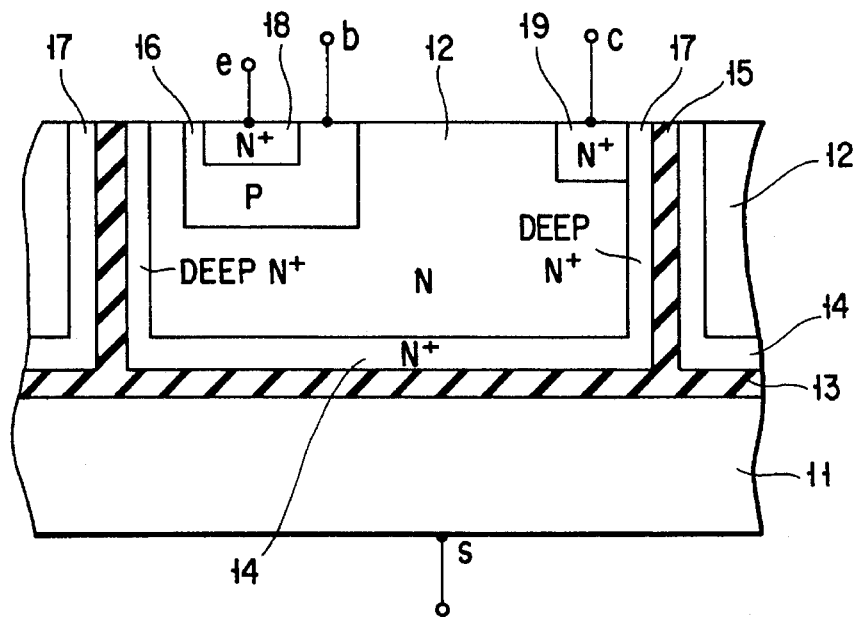
FIG. 4 is a sectional view showing a structure of a semiconductor element having a conventional perfect dielectric isolation structure.

Embodiments of semiconductor devices and a method of increasing a device breakdown voltage of the semiconductor device and the like according to the present invention will be described below with reference to the accompanying drawings.

In a semiconductor device used in the present invention, a semiconductor element such as a bipolar transistor is formed in an element forming region of a perfect dielectric isolation structure consisting of an SOI (Silicon On Insulator) structure (SOI wafer). In this perfect dielectric isolation structure, a composite semiconductor substrate is constituted by a first semiconductor substrate for providing the element forming region, a second semiconductor substrate serving a substrate base, and an oxide film bonded between these substrates. A so-called full depletion (FD) structure is employed to the present invention (Reference: IEEE Trans. Electron Device, Vol. 36, No. 9, P. 1824). More particularly, in this structure, a depletion layer formed by a junction in a well (P-type base) region reaches the oxide film at the bottom so that a part of a bias voltage is applied to the oxide film. The impurity concentration and thickness of the element forming region (active layer) are adjusted to predetermined values in advance to cause full depletion, i.e., to obtain full depletion before junction breakdown occurs. According to the findings of the present inventors, it is found in the semiconductor element having a perfect dielectric isolation structure that the potential of the second semiconductor substrate (substrate base) (this potential will be referred to as a "substrate potential" hereinafter), at which the maximum device breakdown voltage is obtained, falls within a potential range higher than a minimum potential applied to a semiconductor element formed in the element forming region. An experiment and analysis performed by the present inventors to confirm the above phenomenon will be described below.

FIG. 5 is a sectional view showing an arrangement of a full depletion diode (FDD) 20 sample manufactured for the experiment. Note that FIG. 5 shows only the right half with respect to a symmetrical axis Y-Y'. An SOI wafer is a composite semiconductor substrate obtained such that a first semiconductor substrate 22 and a second semiconductor substrate 21 are bonded to each other through an oxide film 23 having a thickness of 1 μm. The thickness of an element forming region (active layer) is 20 μm. The N-type impurity concentration of this region is $4\times10^{14}$ atoms/cm$^3$. A P$^+$-type base region 26 has a depth of 2 μm. An N$^+$-type collector region 27 has a depth of 1 μm. An interval between a base electrode 28 and a collector electrode 29 is 100 μm or more (the interval is freely set in a lateral direction). The interval is set to be 100 μm in the analysis. Although an interelement isolation trench 23a is formed outside the collector electrode 29, the trench 23a is not taken into consideration in the lateral direction can be regarded as free. Regions 24a and 24b indicated by dotted lines in FIG. 5 represent device potential analysis regions to be described later.

FIG. 6 is a graph showing a measurement result obtained in the FDD 20 shown in FIG. 5. In the above structure of the FDD 20, a bias power supply 25 applied a voltage $V_{sb}$ to the second semiconductor substrate 21 using the potential of the base electrode 28 as a reference potential, and a base-collector breakdown voltage $V_{cb}$ was measured. As is apparent from FIG. 6, even when the voltage $V_{sb}$ having a negative value is applied to a substrate 21, the breakdown voltage $V_{cb}$ is saturated. As shown in FIG. 5, when the voltage $V_{sb}$ having a positive value is applied to the substrate 21, the breakdown voltage $V_{cb}$ is increased until the voltage $V_{sb}$ reaches 100 V. However, as is apparent from FIG. 6, when the voltage $V_{sb}$ is higher than 100 V, the breakdown voltage $V_{cb}$ is sharply decreased in the presence of base-collector channel leakage. From the above experimental result, the following important fact is derived. When a substrate potential is higher than a base potential by about 100 V, the maximum breakdown voltage can be obtained.

The above phenomenon was quantitatively analyzed using a two-dimensional device simulator (MOS2C). Before the actual analysis is described, a full depletion (FD) will be visually described in detail below.

FIG. 7A shows a distribution of isopotential lines in the device potential analysis region 24a when the substrate potential is set to be equal to a collector potential in the FDD 20 in FIG. 5, a voltage of 100 V is applied to the collector 29 (i.e., condition $V_{sb}=V_{cb}=100$ V is satisfied in FIG. 5), and condition $V_b=0$ V (in FIG. 6, the voltage $V_{sb}$ having a positive value is applied) is satisfied. As is apparent from FIG. 7A, a depletion layer does not reach an oxide film 23 at the bottom, and the density of the isopotential lines is high at the base end. FIG. 7B shows a surface electric field distribution near a base junction in the above case. As is apparent from FIG. 7B, an electric field is found to be concentrated at the base end.

Figure 8A:
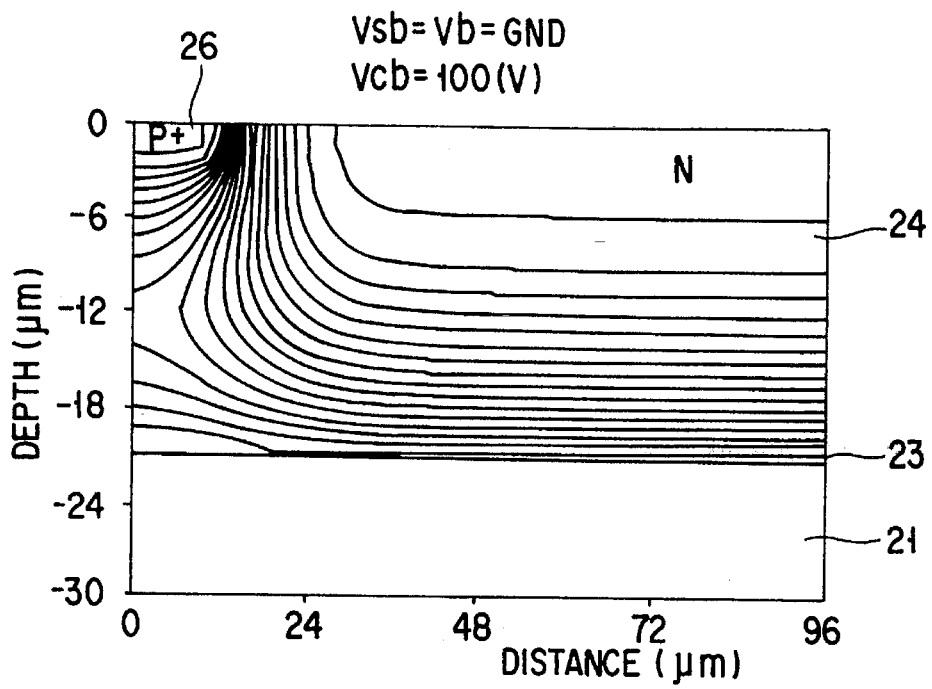
FIG. 8A is a view showing a distribution of potentials in an element when substrate and collector potentials of an FD device are set to be equal to each other.
Figure 8B:
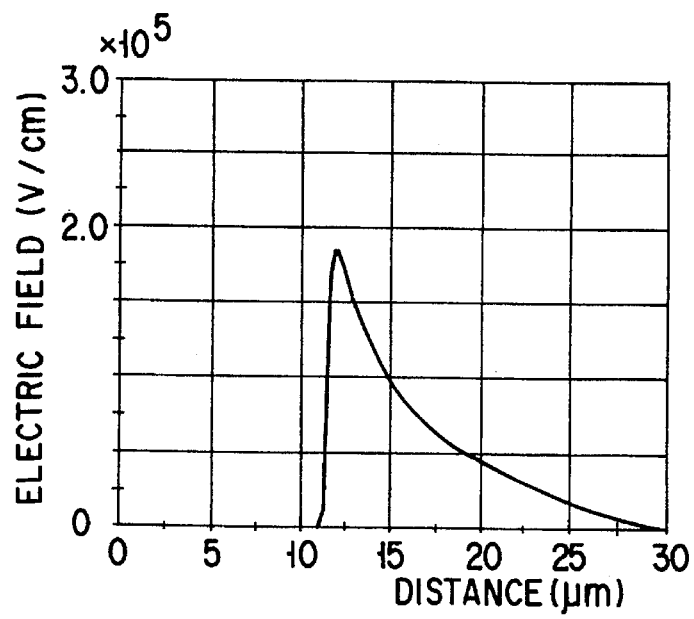
FIG. 8B is a graph showing a surface electric field distribution near a base junction of the FD device of FIG. 8A.

FIGS. 8A and 8B respectively show a distribution of isopotential lines and a surface electric field distribution near a base junction, when the substrate potential of the FDD 20 in FIG. 5 is set to be equal to the base potential, and a voltage of 100 V is applied to the collector. In this case, in FIG. 5, conditions $V_{sb}=0$V, $V_b=0$ V, and $V_{cb}=100$ V are satisfied. As is apparent from FIGS. 8A and 8B, a depletion layer reaches the oxide film 13 at the bottom. The depletion layer extends in the lateral direction except for an N-type neutral region on the surface. FIG. 8A shows that the FDD 20 in FIG. 5 is set in a full depletion state, when the voltage $V_{cb}$ is further increased, the N-type neutral region on the surface is depleted. A depletion layer is expected to easily extend from the base end. In practice, the surface electric field at the base end is $2.3\times10^5$ V/cm in the case shown in FIG. 7B. As compared with this, the surface electric field at the base end in the case in FIG. 8B is relaxed to, i.e., $1.8\times10^5$ V/cm.

Figure 10A:
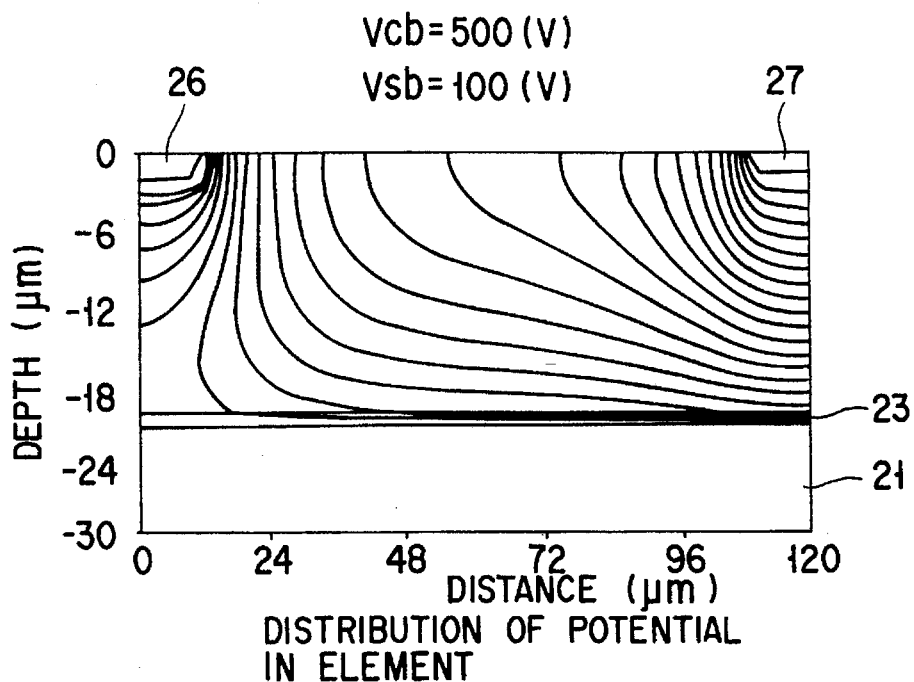
FIG. 10A is a view showing a distribution of potentials in an element when an FD device is used under conditions $V_{bc}$=500 V and $V_{sb}$=100 V.
Figure 10B:
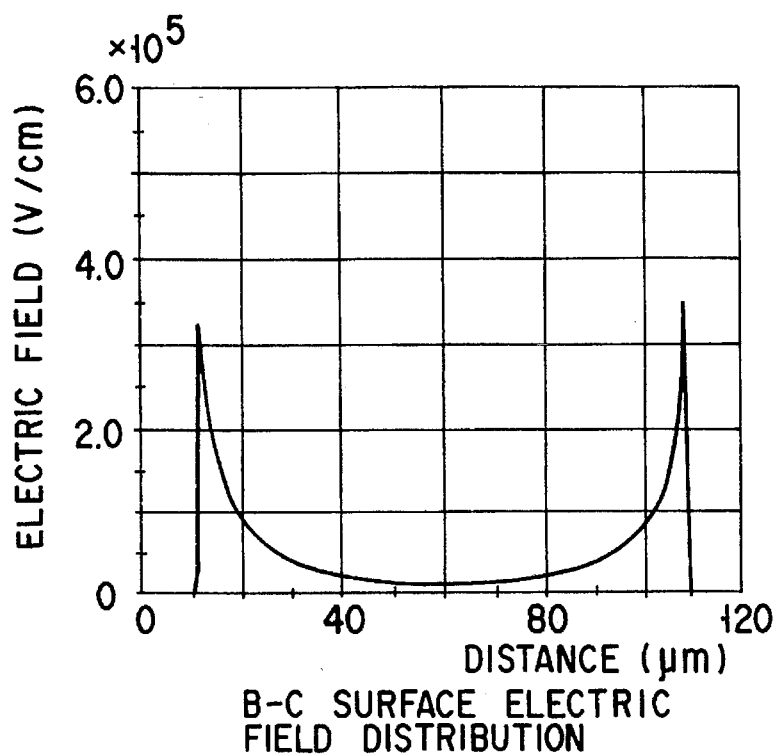
FIG. 10B is a graph showing a surface electric field distribution between the base and collector of the FD device in FIG. 10A.
Figure 11A:
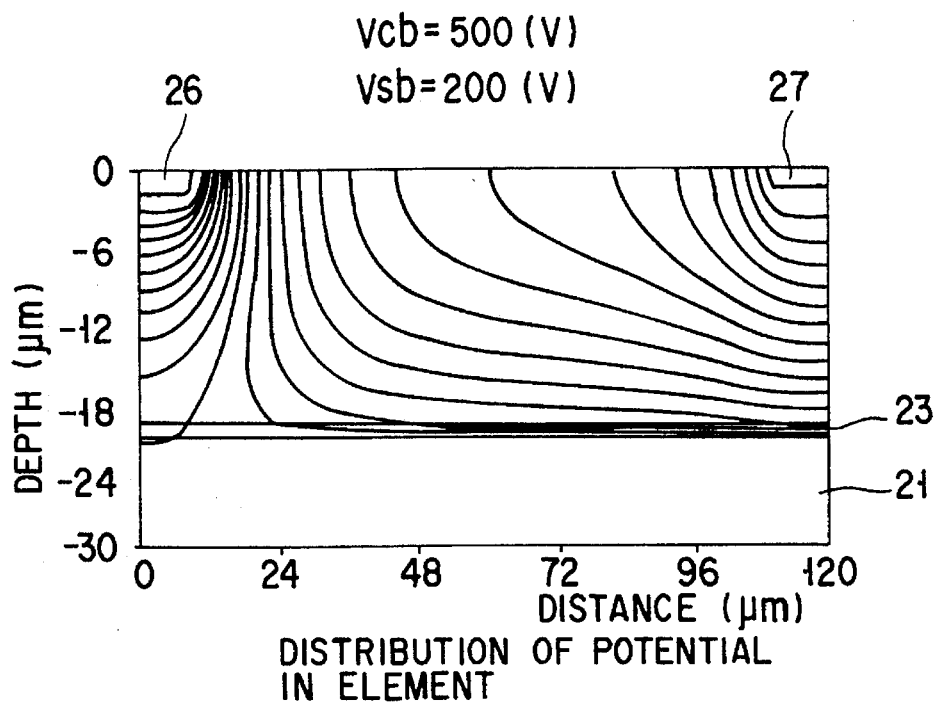
FIG. 11A is a view showing a distribution of potentials in an element when an FD device is used under conditions $V_{bc}$=500 V and $V_{sb}$=200 V.
Figure 11B:
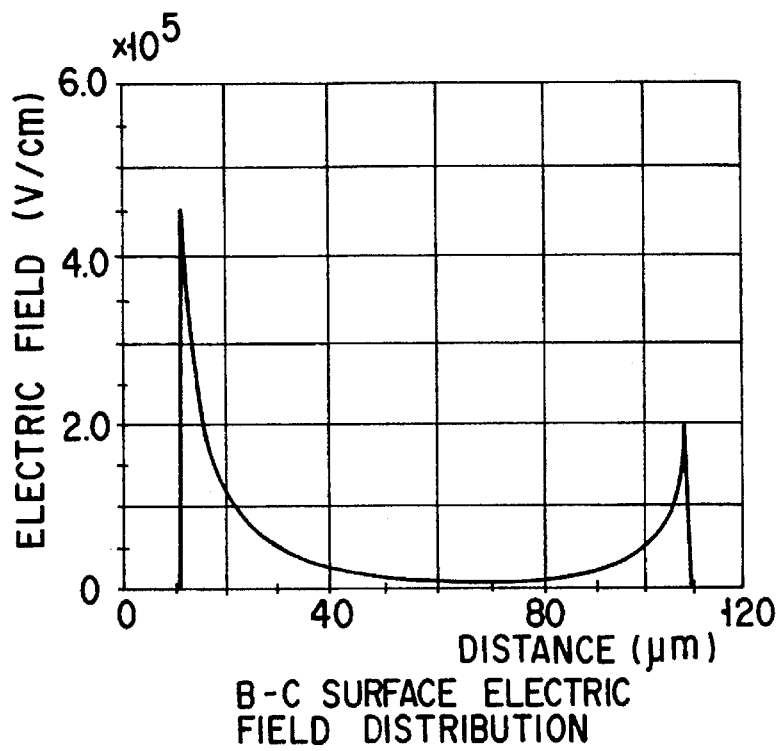
FIG. 11B is a graph showing a surface electric field distribution between the base and collector of the FD device in FIG. 11A.

The same analysis as described above was performed to the FDD 20 shown in FIG. 5, under the condition that a voltage $V_{cb}=500$ V (constant) is applied to the device potential analysis region 24b including an N$^+$-type collector region 17. FIG. 9A shows a distribution of potentials in the element when conditions $V_{cb}=500$ V and $V_{sb}=0$ V are satisfied. FIG. 9B shows a base-collector surface electric field distribution under the same conditions as in FIG. 9A. FIG. 10A shows a distribution of potentials in the element when conditions $V_{cb}=500$ V and $V_{sb}=100$ V are satisfied. FIG. 10B shows a base-collector surface electric field distribution under the same conditions as in FIG. 10A. FIG. 11A shows a distribution of potentials in the element when conditions $V_{cb}=500$ V and $V_{sb}=200$ V are satisfied. FIG. 11B shows a base-collector surface electric field distribution under the same conditions as in FIG. 11A. Under conditions corresponding to $V_{sb}=0$ in FIG. 6, an electric field is maximumly concentrated on an end of the N$^+$-type collector region 17. Under conditions corresponding to $V_{sb}=100$ V in FIG. 6, peak electric fields at the end of the collector region 17 and at the end of the base region 16 are averaged to decrease a maximum electric field value. Under conditions corresponding to $V_{cb}=200$ V in FIG. 6, an electric field is maximumly concentrated on the end of the P$^+$-type base region 16.

The results of the experiments and analyses described above with reference to FIGS. 5 to 11B are summarized as follows. In the FDD 20 using the SOI wafer, an electric field is concentrated on diffusion layer end portions, i.e., major junctions on the surface. Electric field strengths at these end portions are different from each other depending on the dimensions of elements. These electric field strengths can be balanced with each other by optimizing the substrate potential, when the substrate potential is set to be higher than the minimum potential applied to a semiconductor device formed in the element forming region, the strength of an electric field applied to a major junction of the semiconductor device can be decreased so as to increase a device breakdown voltage.

FIG. 12 is a sectional view showing an arrangement of a semiconductor device according to the first embodiment of the present invention and a connection of a bias voltage and the like. In this embodiment, a P$^+$NN$^+$ diode 30 is exemplified as a single semiconductor device having a composite semiconductor substrate. A composite semiconductor substrate (SOI wafer) 35 is formed such that an N-type first semiconductor substrate 32 and an N-type second semiconductor substrate 31 are bonded to each other through an oxide interlayer 33. A P⁺-type base region 36 and an N⁺-type collector region 37 are formed in an element forming region of the first semiconductor substrate 32. The element forming region has a thickness $t_N=20$ μm and an impurity concentration $N_D=4\times10^{14}$ atoms/cm³. The oxide interlayer 33 has a thickness $t_{OX}=1$ μm. A P+-type base region has a depth $x_3=3$ μm. The thickness $t_N$ and the impurity concentration $N_D$ of the element forming region are determined such that a junction depletion layer set in a full depletion state reaches the oxide interlayer 33 before junction breakdown occurs between the P⁺-type region 36 and the element forming region of the first semiconductor substrate 32. This condition will be satisfied in embodiments following the first embodiment. As a means for adjusting the potential of the second semiconductor substrate 31 to a potential higher than the minimum potential in the element forming region, a bias power supply ($V_{sb}$) 34 is arranged. Although this bias power supply 34 can be arranged as a device in a chip, the bias power supply 34 may be arranged as an external circuit. Similarly, a bias power supply ($V_{cb}$) 34a is arranged in addition to the bias power supply 34. In general, as will be described later, the bias power supply 34 biases the substrate potential such that the substrate potential is set to be an optimal value for a base potential which is the minimum potential in the element forming region.

FIGS. 13A to 13C show three examples of an arrangement of the bias power supply ($V_{sb}$) 34 in FIG. 12. In FIG. 12A, P-type diffusion resistor 246 which uses a surface resistance of the semiconductor material is formed in the first semiconductor substrate 32. The substrate 32 is surrounded by the perfect dielectric isolation structure consisting of an oxide interlayer 33a and an isolation trench 33b. An oxide layer 34c is formed on the diffusion resistor 34b. A predetermined number of connecting electrodes 34d are formed in contact with the surface of the diffusion resistor 24b at a constant distance to divide the resistance value of the diffusion resistor 346. The connecting electrode 34d on one side is connected to the $V_{CC}$ power supply and the connecting electrode 34d on the other side is connected to the ground (GND). As a result, a desired bias voltage can be derived by selecting one of the connecting electrodes 34d since the voltage $V_{CC}$ is divided according to the number of the connecting electrodes 34d. In FIG. 23B, the first semiconductor substrate 32 per se is used as a resistor instead of the diffusion resistor 34b in FIG. 13A. In FIG. 13C, a polysilicon layer 24e is formed as a resistor on the oxide layer 34C formed on the first semiconductor substrate 32.

FIG. 14 is a sectional view showing an arrangement of a semiconductor device according to the present invention and a bias connection method. In the second embodiment, the single diode of FIG. 14 is arranged as an integrated circuit. An N-type first semiconductor substrate 32 and an N-type second semiconductor substrate 31 are bonded to each other through the oxide interlayer 33a to form a composite semiconductor substrate 35. In the second embodiment, the isolation trench 33b consisting of an insulator is formed from the major surface of the first semiconductor substrate to reach the oxide film 33a and to surround the element forming region. An element isolation layer 33 is constituted by the oxide interlayer 33a and the insulator isolation trench 33b. A P⁺-type base region 36 and an N⁺-type collector region 37 are formed in the element forming region, thereby forming a P⁺NN⁺ diode 30. A bias power supply ($V_{sb}$) 34 serving as a means for adjusting the substrate potential is also connected to the P⁺NN⁺ diode 30, as shown in FIG. 14.

A reverse bias power supply ($V_{cb}$) 34a is also connected to the diode 30.

A measuring method of determining the optimal potential of the second semiconductor substrate 31 will be described below with reference to FIG. 14. The reverse bias power supply ($V_{cb}$) 34a is connected between a grounded base electrode terminal b and a collector electrode terminal c. The vias power supply ($V_{sb}$) 34 is connected between the base electrode terminal b and an electrode terminal s of the second semiconductor substrate 31. The base electrode terminal b is set to be a reference potential GND, and the bias power supply 34 is adjusted to apply a bias voltage falling within a range of −200 V to +200 V to substrate electrode terminal s by every 50 V. The power supply $V_{cb}$ in FIG. 14 is increased each time the bias potential is increased by 50 V. A voltage value $V_{cb}$ is obtained when a reverse current $I_{cb}$ flowing across the electrode terminals b and c reaches 1 mA is read. This value $V_{cb}$ is regarded as the breakdown voltage of the diode 30.

FIG. 15 is a graph showing the measurement result, i.e., a relationship between the potential and the breakdown voltage of the second semiconductor substrate. In FIG. 15, the abscissa represents the potential $V_{sb}$ of the second semiconductor substrate 31 with respect to a ground potential. The ordinate represents the breakdown voltage $V_{cb}$ of the diode 30 corresponding to each substrate potential $V_{sb}$. When a negative bias voltage in the range of −200 to 0 V is applied to the substrate, the breakdown voltage is rarely changed. On the other hand, when a positive bias voltage in the range of 0 to +100 V is applied to the substrate, the breakdown voltage is gradually increased, and a maximum breakdown voltage of about 600 V can be obtained. When the positive bias voltage of 100 V or more is further increased, a reverse current, i.e., leakage current $I_{cb}$ is increased to sharply decrease the breakdown voltage. That is, in the second embodiment, following effects can be obtained. The potential of the second semiconductor substrate 31 has an optimal value. When the second semiconductor substrate 31 is used such that its potential is set to be higher than the minimum potential (GND) in the element forming region by 100 V, the maximum breakdown voltage can be obtained.

In the second embodiment, as in the above conventional P-N junction element isolation structure, when a P-type substrate is used such that the potential of the P-type substrate is set to be the minimum potential in the element forming region, i.e., when the P-type substrate is used under condition $V_{sb}=0$ V, a breakdown voltage of 500 V can be obtained. This value itself is a large value which cannot be obtained by an epitaxial wafer of a conventional P-N junction element isolation structure in which the thickness $t_{VG}=10$ μm and the concentration $N_{sub}=4\times10^{14}$ atoms/cm³. Furthermore, when the substrate potential $V_{sb}$ is biased to 100 V, a breakdown voltage of 600 V can be obtained. This value may be a maximum value which can be determined by a substrate concentration. It is apparent that this characteristic can also be obtained in the first embodiment of a single semiconductor element in FIG. 12. In the second embodiment, an optimal potential at which the breakdown voltage of the second semiconductor substrate 32 is set to be maximum is determined by the thickness tN and impurity concentration of the element forming region, the thickness of the oxide interlayer 33a, the depth of the P⁺-type base region, and the like. For this reason, when a semiconductor element is determined, an optimal potential of the second semiconductor substrate can be uniquely determined by the above measuring method.

With reference of FIG. 16, the third embodiment of a semiconductor device according to the present invention will be described below. In the third embodiment, an NPN transistor is arranged as an integrated circuit. An element forming region surrounded by an insulator isolation trench 13b and an oxide interlayer 13a is formed in a composite semiconductor substrate 15. The substrate 15 consists of an N-type first semiconductor substrate 12, the oxide interlayer 13a, and an N- or P-type second semiconductor substrate 11. A P-type base region 36 and an $N^+$-type collector region 19 are formed in the first semiconductor substrate 12. An $N^+$-type emitter region 18 is formed in the P-type base region 36. When an emitter electrode terminal e is disconnected, the breakdown voltage is measured by a method as in the second embodiment, such that an optimal potential of the substrate 11 can be uniquely obtained. It is apparent that the same effect as described above can be obtained in a single NPN transistor.

Referring now to FIG. 17, the fourth embodiment of a semiconductor device according to the present invention will be described below. FIG. 17 is a sectional view showing an element when a CMOS inverter is formed in an element forming region 44 and showing a connection of a bias power supply and the like for measuring an optimal potential of a second semiconductor substrate 41. A P-well region 46 is formed in an element forming region surrounded by an oxide interlayer 43a and an insulator isolation trench 43b. An N-channel MOSFET 48 is formed in the P-well region 46. A P-channel MOSFET 49 is formed in a portion other than the P-well region in the element forming region. Reference numeral 49a denotes a $V_{DD}$ power supply terminal; 49b, an output terminal; 49c, an input terminal; and 49d, a $V_{SS}$ power supply terminal. A bias voltage $V_{sub}$ is applied across the power supply terminal 49d and a second semiconductor electrode terminal S by a bias power supply 44a. When the input terminal 49c and the output terminal 49b are disconnected, a breakdown voltage is measured by a method as in the second embodiment, such that an optimal potential of the substrate 41 can be obtained. The same effect as described above can be obtained in a single CMOS inverter.

With reference to FIG. 18, the fifth embodiment of the present invention will be described below. FIG. 18 is a sectional view showing an element when a lateral double-diffused MOSFET is formed in an element forming region and showing a connection of a bias power supply and the like. A P-type base region 56 and an $N^+$-type drain region 57 are formed in an element forming region surrounded by an oxide interlayer 53a and an insulator isolation trench 53b. A source region 58 is formed in the P-type base region 56. The $N^+$-type source region 58 and the P-type base region 56 are short-circuited to each other by a source electrode film 54. A bias voltage $V_{DS}$ is applied across a drain electrode terminal D and a source electrode terminal $S_0$. A bias voltage $V_{SS}$ is applied across the source electrode terminal $S_0$ and a second semiconductor substrate electrode terminal S. When a gate terminal G is disconnected, a breakdown voltage is measured by a method as in the second embodiment, such that an optimal potential of a substrate 51. The same effect as described above can be obtained in a single FET.

A means for fixing the potential of the second semiconductor substrate to an optimal potential higher than the minimum potential in the element region may be arranged inside the semiconductor device, e.g., on a chip, or the means may be arranged in an external circuit of the semiconductor device.

FIG. 19 is a plan view schematically showing an arrangement of a lateral DMOSFET as the sixth embodiment of the semiconductor device of the present invention. A drain electrode 72 is arranged in the middle of FIG. 19 and a gate electrode 73 and a source electrode 71 are arranged circularly to surround the drain electrode 72. A distance ls indicates a distance between the drain electrode 72 and the gate electrode 73.

FIG. 20 is a sectional view showing the arrangement of the lateral DMOSFET taken along a line I—I in FIG. 19. In FIG. 20, only one side of the DMOSFET is shown with respect to the symmetric axis for the sake of simplicity. A composite semiconductor substrate 65 consists of an N-type first semiconductor substrate 62, an oxide interlayer 63a, and an N-type second semiconductor substrate 61. The first semiconductor substrates 62 are isolated by the oxide interlayer 63a and the insulating trench 63b with each other. In this embodiment, the thickness $t_{si}$ of the first semiconductor substrate 62 is set to 10(μm) and the thickness $t_{sio}$ of the oxide interlayer 63a is set to 1(μm), for example. The resistivity of the first semiconductor substrate 62 is selected at 5 (Ω.cm). An $N^+$-type drain region 66 are formed in the first semiconductor substrate 62. An $N^+$-type source region 68 is formed in the P-type well region 66. An oxide layer 64 is formed on the surface of the first semiconductor substrate 62. A gate 70 consisting of a polysilicon layer is formed on the oxide layer 64 in a partial region between the source and drain electrodes 68 and 67. Reference numerals 71, 72 and 73 denote a source electrodes, a drain electrode and a gate electrode, respectively. Numeral 69 denotes an oxide layer. A bias voltage $V_{ss}$ is applied to the second semiconductor substrate 61 by the bias power supply ($V_{ss}$) 74 on the basis of the source potential. Bias voltages $B_{GS}$ and $V_{DS}$ are also applied to the gate electrode 73 and the drain electrode 72 by the power supplies 75 and 76, respectively, based on the source potential.

FIG. 21 shows a drain-source breakdown voltage vs substrate potential characteristic of the lateral DMOSFET in FIG. 19. The drain-source breakdown voltage $V_{DS}$ Changes according to changes of the substrate potential $V_{ss}$ of the second semicondutor substrate 61. In FIG. 21, a drain-source breakdown voltage $V_{DS}$ versus drain-source current $I_{DS}$ is illustrated when the bias voltages $V_{ss}$ (V) of the second semiconductor substrate 61 are set to −100 (V), −50 (V), 0 (V), +50 (V) and +100 (V) under the condition of the gate bias voltage $V_{GS}$=0 (V). The breakdown voltages $V_{DS}$ can be derived as 226 (V), 250 (V), 300 (V),348 (V) and 382 (V) according to the above bias voltages $V_{ss}$ when the drain-source current IDS is equal to 100 (μA). Consequently, a device breakdown voltage, i.e., drain-source breakdown voltage can be remarkably increased by setting the substrate potential $V_{ss}$ to a positive value.

Figure 22B:
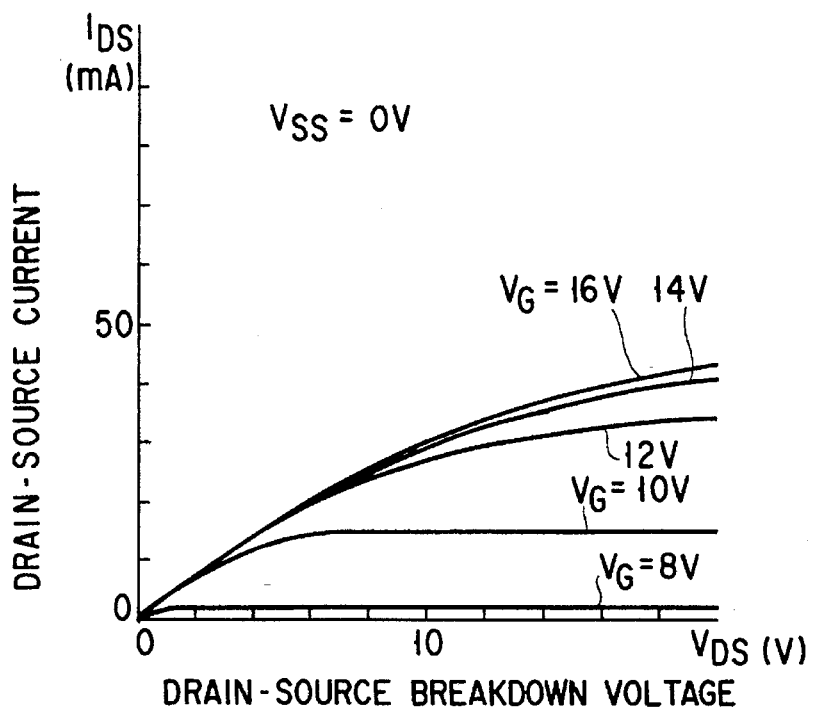
Figure 22C:
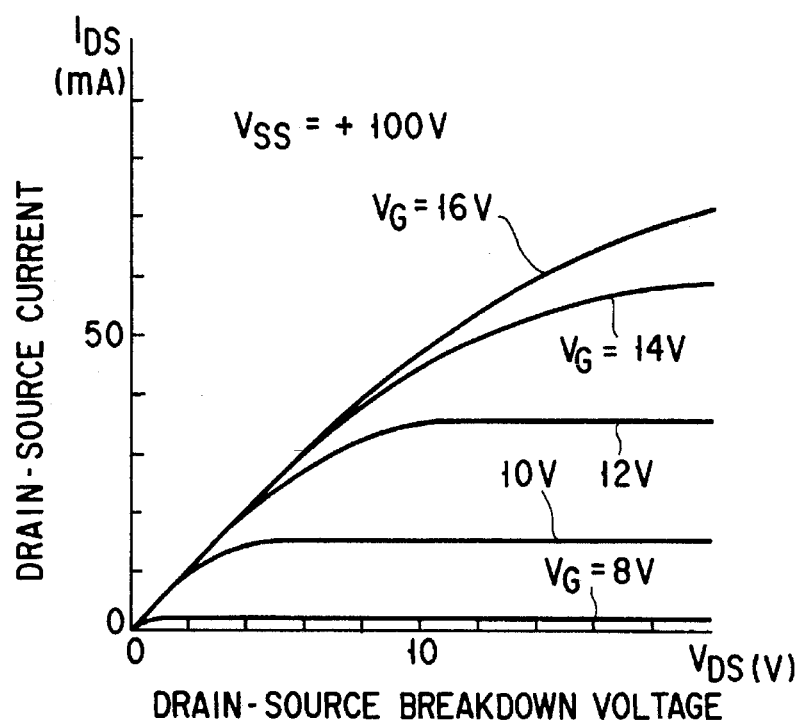

FIGS. 22A to 22C are views each showing an FET operation characteristic of the lateral DMOSFET in FIG. 19. FIGS. 22A, 22B and 22C respectively show a drain-source breakdown voltage $V_{DS}$ vs, drain-source current $I_{DS}$ characteristic when the substrate bias voltages $V_{ss}$ are set to −100 (V), 0 (V) and +100 (V), respectively. A threshold value $V_{th}$ of the bias voltage $V_{GS}$ is 7.5 (V). In FIG. 22A in which the substrate potential is biased to a negative value, when the gate bias voltage $V_{GS}$ is in excess of 12 (V), the drain-source current $I_{DS}$ is saturated even if the gate voltage is increased up to 14 (V). This is because the current $I_{DS}$ is limited due to the electric resistance of the active layer, i.e., active region between the drain-source region of the first semiconductor substrate 62. In FIG. 22B in which the substrate potential is set to be equal to the potential of the source electrode i.e., GND, the saturation of the drain-source current $I_{DS}$ starts when the voltage $V_{GS}$ exceeds 14 (V). The drain-source currents $I_{DS}$ are increased under the same gate bias voltages $B_{GS}$ in contrast to the currents $I_{DS}$ shown in FIG. 22A. In FIG. 22C in which the substrate potential is biased to a positive value, the drain-source currents $I_{DS}$ can be increased according to the increase of the gate bias voltage $B_{GS}$, and are not saturated. The FET operation is thus improved by keeping the substrate potential positive. This is because an electric resistance of the first semiconductor substrate 62 can be reduced by a MOS storage layer effect that an $N^+$ storage layer is formed in the first semiconductor substrate 62 adjacent to the oxide interlayer 63a.

Figure 23:
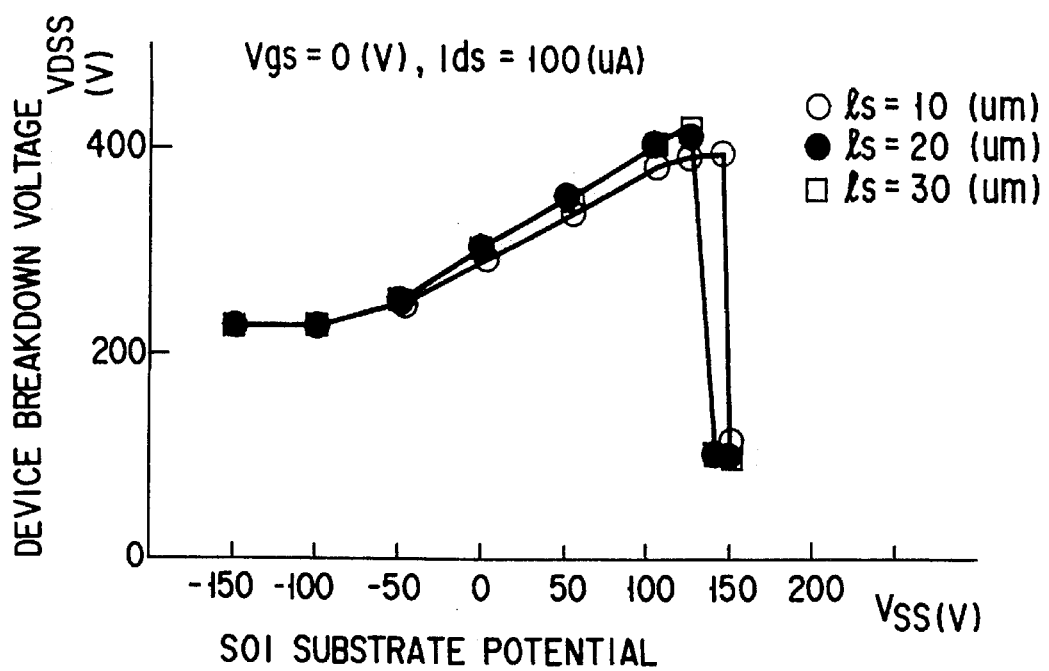
FIG. 23 is a graph showing a substrate potential dependency of a device breakdown voltage of the semiconductor device in FIG. 29.

FIG. 23 is a graph showing a substrate potential dependency of the device breakdown voltage $VD_{SS}$ of the lateral DMOSFET in FIG. 19. A half cell size of the used FET is 95+1 s(μm), where ls is a drain-gate electrode distance. A SOI substrate potential $V_{ss}$(V) is measured on the basis of the source potential. And, the drain-source breakdown voltage $V_{GS}$ is set to 0 (V), and the drain source current $I_{DS}$ is set to 100 (μA). In FIG. 23, the voltage $VD_{SS}$(IV) is measured in the range of −150 (V) to +150 (V) of the potential $V_{ss}$ using the distance ls as a parameter, i.e., ls=10 μm, 20 μm and 30 μm. As to the distances ls=20 and 30 (μm), a maximum voltage $VD_{SS}$(V) is derived at the potential $V_{ss}$=120 (V). In case of the distance ls=10 (μm), a maximum voltage $VD_{SS}$ can be obtained at the potential $V_{ss}$=140 (V). It is noted that the device breakdown voltage is increased by about 100 (V) in contrast to the breakdown voltage derived at the substrate potential=0 (V).

Figure 24:
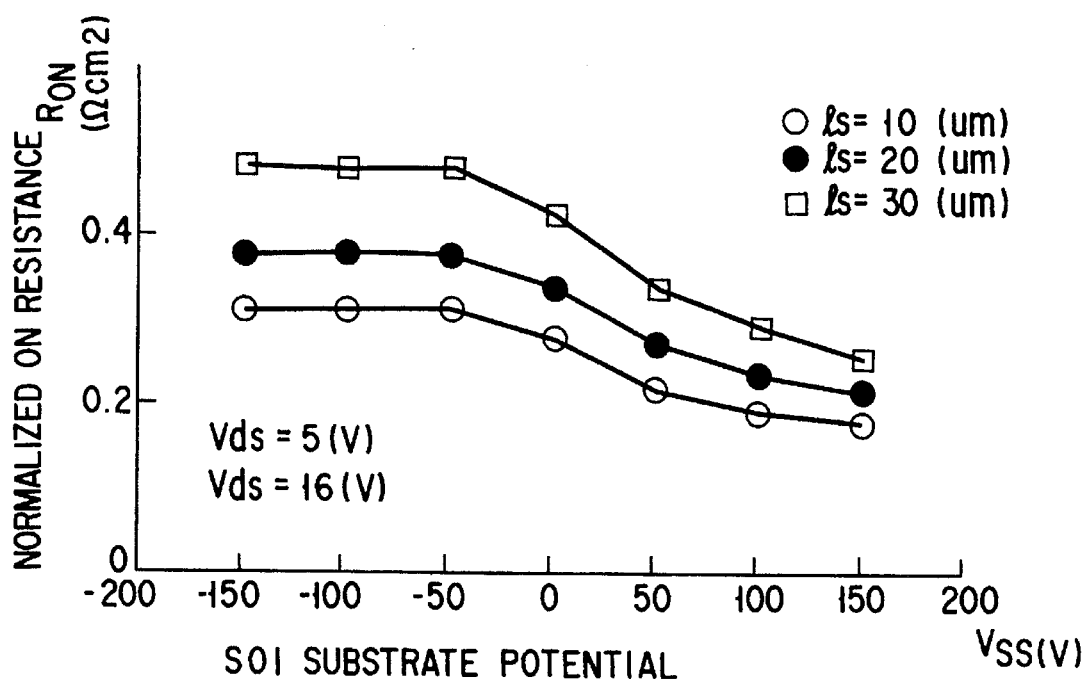
FIG. 24 is a graph showing a substrate potential dependency of an ON resistance RON of the semiconductor device in FIG. 19.

FIG. 24 is a graph showing a substrate potential dependency of the ON resistance $R_{ON}$ of the lateral DMOSFET in FIG. 19. A half cell size of the used FET is also 95+ls (μm), where ls is a drain-gate electrode distance. A SOI substrate potential $V_{ss}$(V) is also measured based on the source potential. The voltage $V_{DS}$ and the voltage $V_{GS}$ are set to 5 (V) and 16 (V), respectively. The resistance $R_{ON}$ for the distance ls=10 (μm) is smaller than that for the distance ls=30 (μm) if the substrate potential $V_{ss}$ is the same. Thus it is clear that the FET operation can be improved. As shown in FIG. 24, the normalized ON resistances $R_{ON}$(Ωcm$^2$) are linearly decreased. In general, the device breakdown voltage $VD_{SS}$ and the ON resistance $R_{ON}$ have a trade-off relation. However, in the sixth embodiment of the present invention, both the voltage $VD_{SS}$ and the resistance $R_{ON}$ can be improved by biasing the substrate potential to a positive value.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a composite semiconductor substrate comprising a first semiconductor substrate, a second semiconductor substrate, and an oxide interlayer bonded therebetween, said first semiconductor substrate including an element forming region having a thickness and an impurity concentration such that full depletion of a depletion layer occurs in said first substrate before a junction breakdown in said element forming region, and
   potential setting means for setting a potential of said second semiconductor substrate at a potential higher than a minimum potential in said element forming region of said first semiconductor substrate, said potential setting means having potential fixing means for fixing said potential of said second semiconductor substrate to an optimal potential value at which a maximum device breakdown voltage is obtained.

2. A device according to claim 1, further comprising a predetermined semiconductor element formed in said element forming region of said first semiconductor substrate.

3. A device according to claim 2, wherein said semiconductor element consists of a $P^+NN^+$ diode.

4. A device according to claim 2, wherein said semiconductor element consists of an NPN transistor.

5. A device according to claim 2, wherein said semiconductor element consists of a CMOS inverter.

6. A device according to claim 2, wherein said semiconductor element consists of a lateral double-diffused MOSFET.

7. A device according to claim 2, wherein said semiconductor element consists of a lateral MOS FET.

8. A semiconductor integrated circuit device comprising:
   a composite semiconductor substrate comprising a first semiconductor substrate, a second semiconductor substrate, and an oxide interlayer bonded therebetween, said first semiconductor substrate including an element forming region having a thickness and an impurity concentration such that full depletion of a depletion layer occurs in said first substrate before a junction breakdown in said element forming region;
   an insulating isolation trench extending from a major surface of said first semiconductor substrate to reach said oxide interlayer and to surround said element forming region, said insulating isolation trench being buried with an insulator; and
   potential setting means for setting a potential of said second semiconductor substrate at a potential that is higher than a minimum potential in said element forming region of said first semiconductor substrate and is set within a potential range between first and second potentials corresponding to a range of relatively increased device breakdown voltages between which a maximum device breakdown voltage occurs, to thus attain an increased device breakdown voltage, wherein said potential setting means has potential fixing means for fixing said potential of said second semiconductor substrate to an optimal potential value within said potential range and corresponding to said maximum device breakdown voltage.

9. A device according to claim 8, further comprising a predetermined semiconductor element formed in said element forming region of said first semiconductor substrate.

10. A device according to claim 9, wherein said semiconductor element consists of a $P^+NN^+$ diode.

11. A device according to claim 9, wherein said semiconductor element consists of an NPN transistor.

12. A device according to claim 9, wherein said semiconductor element consists of a CMOS inverter.

13. A device according to claim 9, wherein said semiconductor element consists of a lateral double-diffused MOSFET.

14. A device according to claim 9, wherein said semiconductor element consists of a lateral MOS FET.

15. A method of increasing a device breakdown voltage of a semiconductor device, comprising the steps of:
   providing a semiconductor substrate having a dielectric isolation structure consisting of a composite semiconductor substrate formed by bonding a first semiconductor substrate and a second semiconductor substrate to each other through an oxide interlayer and including an insulating isolation trench extending from a major surface of said first semiconductor substrate to reach said oxide interlayer and to surround an element forming region, said insulating isolation trench being buried with an insulator;

forming a type of a semiconductor element in said element forming region;

specifying a minimum potential used in said semiconductor element according to the type of said semiconductor element; and biasing said second semiconductor substrate to a predetermined potential that is higher than said minimum potential in an element forming region of said first semiconductor substrate and within a potential range between first and second potentials corresponding to a range of relatively increased device breakdown voltages between which a maximum device breakdown voltage occurs, to thus attain the maximum device breakdown voltage, wherein the step of biasing includes the step of setting the potential of said second semiconductor substrate to an optimal potential for obtaining the maximum device breakdown voltage, the step of setting the potential of said second semiconductor substrate to the optimal potential including the step of determining the optimal potential based on a thickness and impurity concentration of said element forming region, a thickness of said oxide interlayer, and a depth of a predetermined diffusion region of said semiconductor element, to thereby provide the maximum device breakdown voltage of said first semiconductor substrate.

16. A method of decreasing an ON resistance of a lateral MOSFET comprising the steps of:

providing a semiconductor substrate having a dielectric isolation structure consisting of a composite semiconductor substrate comprising a first semiconductor substrate, a second semiconductor substrate, and an oxide interlayer bonded therebetween and including an insulating isolation trench extending from a major surface of said first semiconductor substrate to reach said oxide interlayer and to surround said lateral MOSFET, said insulating isolation trench being buried with an insulator;

specifying a polarity of majority carriers in said first semiconductor substrate according to a conductivity type of said lateral MOSFET; and applying a bias voltage having a polarity opposite to said polarity of majority carriers in said first semiconductor substrate to said second semiconductor substrate through said oxide interlayer to thereby decrease an ON resistance of said first semiconductor substrate.

17. A method according to claim 16, wherein said step of applying said bias voltage includes the step of decreasing said ON resistance of said first semiconductor substrate according to an increase of said bias voltage of said second semiconductor substrate.

18. A method according to claim 16, wherein said bias voltage of a negative polarity is applied to said second semiconductor substrate when said first semiconductor substrate is a P-type semiconductor substrate.

19. A method according to claim 16, wherein said bias voltage of a positive polarity is applied to said second semiconductor substrate when said first semiconductor substrate is an N-type semiconductor substrate.

* * * * *